US012580543B2

(12) United States Patent
Yamaguchi et al.

(10) Patent No.: US 12,580,543 B2
(45) Date of Patent: Mar. 17, 2026

(54) METHOD FOR MANUFACTURING VIBRATOR ELEMENT

(71) Applicant: SEIKO EPSON CORPORATION, Tokyo (JP)

(72) Inventors: Keiichi Yamaguchi, Ina (JP); Hiyori Sakata, Shinagawa (JP); Shigeru Shiraishi, Ina (JP); Ryuta Nishizawa, Nagano (JP)

(73) Assignee: SEIKO EPSON CORPORATION (JP)

( * ) Notice: Subject to any disclaimer, the term of this patent is extended or adjusted under 35 U.S.C. 154(b) by 618 days.

(21) Appl. No.: 18/077,259

(22) Filed: Dec. 8, 2022

(65) Prior Publication Data

US 2023/0188109 A1     Jun. 15, 2023

(30) Foreign Application Priority Data

Dec. 9, 2021     (JP) ................................. 2021-199911

(51) Int. Cl.
H03H 3/02         (2006.01)
H03H 9/215        (2006.01)

(52) U.S. Cl.
CPC .............. H03H 3/02 (2013.01); H03H 9/215 (2013.01); *H03H 2003/026* (2013.01)

(58) Field of Classification Search
CPC ........ H10N 30/082; H10N 30/06; H03H 9/21; H03H 9/215; H03H 2003/026; H03H 3/02
See application file for complete search history.

(56) References Cited

U.S. PATENT DOCUMENTS 4,472,654 A * 9/1984 Nakamura ............... H03H 9/21
                                                        310/312
6,046,531 A * 4/2000 Kikuchi ............. G01C 19/5621
                                                        73/504.03

(Continued)

FOREIGN PATENT DOCUMENTS

JP        2007-013382 A       1/2007
JP        2008-205657 A       9/2008

(Continued)

*Primary Examiner* — Jeffrey T Carley
(74) *Attorney, Agent, or Firm* — Harness, Dickey & Pierce, P.L.C.

(57)        ABSTRACT

Provided is a method for manufacturing a vibrator element including a first vibration arm and a second vibration arm that each have a first surface and a second surface. The manufacturing method includes a preparation step of preparing a quartz crystal substrate, a first protective film forming step of forming a first protective film on a first substrate surface of the quartz crystal substrate, a first dry etching step of dry etching the quartz crystal substrate via the first protective film, a second protective film forming step of forming a second protective film on a second substrate surface of the quartz crystal substrate, and a second dry etching step of dry etching the quartz crystal substrate via the second protective film. Outer shapes of the first vibration arm and the second vibration arm are formed from the first surface to the second surface in the first dry etching step, and the outer shapes of the first vibration arm and the second vibration arm are not formed in the second dry etching step.

7 Claims, 28 Drawing Sheets

(56) References Cited

U.S. PATENT DOCUMENTS

| | | | | |
|---|---|---|---|---|
| 6,791,243 B2 * | 9/2004 | Kawashima | H04R 31/00 | 310/319 |
| 6,881,649 B2 * | 4/2005 | Kouma | G02B 26/0841 | 438/460 |
| 7,482,277 B2 * | 1/2009 | Barwicz | H01L 21/76813 | 438/720 |
| 7,553,609 B2 * | 6/2009 | Aratake | H03H 9/0595 | 430/318 |
| 7,861,387 B2 * | 1/2011 | Hokibara | C03C 15/00 | 430/314 |
| 7,948,156 B2 * | 5/2011 | Satoh | H03H 9/21 | 310/365 |
| 8,156,621 B2 * | 4/2012 | Iwai | C23F 1/14 | 29/25.35 |
| 8,183,743 B2 * | 5/2012 | Petrenko | H02N 2/002 | 310/317 |
| 8,365,371 B2 * | 2/2013 | Amano | H10N 30/06 | 29/25.35 |
| 8,373,333 B2 * | 2/2013 | Yamada | H03H 9/02062 | 310/368 |
| 8,400,048 B2 * | 3/2013 | Shirai | H03H 9/21 | 73/504.16 |
| 8,580,126 B2 * | 11/2013 | Sasaki | H03H 9/1014 | 216/2 |
| 8,633,637 B2 * | 1/2014 | Nishizawa | H03H 9/19 | 310/370 |
| 10,072,928 B2 * | 9/2018 | Ishii | H10N 30/302 | |
| 10,447,237 B2 * | 10/2019 | Oga | H03H 9/10 | |
| 10,748,777 B2 * | 8/2020 | Eom | G02F 1/1345 | |
| 11,070,191 B2 * | 7/2021 | Fang | H03H 9/02023 | |
| 11,584,641 B2 * | 2/2023 | Tani | G01P 15/131 | |
| 12,078,813 B2 * | 9/2024 | Ochiai | G02B 27/0994 | |
| 12,213,381 B2 * | 1/2025 | Sakata | H03H 9/19 | |
| 2003/0071542 A1 * | 4/2003 | Satoh | H03H 3/08 | 310/367 |
| 2005/0116586 A1 * | 6/2005 | Tanaya | H03H 9/21 | 310/348 |
| 2009/0152994 A1 * | 6/2009 | Numata | H03H 9/1021 | 29/25.35 |
| 2009/0206704 A1 * | 8/2009 | Kitamura | H03H 9/0547 | 310/357 |
| 2017/0126200 A1 * | 5/2017 | Matsuo | H03H 3/02 | |

FOREIGN PATENT DOCUMENTS

| | | | |
|---|---|---|---|
| JP | 2013-175933 A | 9/2013 |
| JP | 2018-148380 A | 9/2018 |

* cited by examiner

METHOD FOR MANUFACTURING VIBRATOR ELEMENT

The present application is based on, and claims priority from JP Application Serial Number 2021-199911, filed on Dec. 9, 2021, the disclosure of which is hereby incorporated by reference herein in its entirety.

BACKGROUND

1. Technical Field

The present disclosure relates to a method for manufacturing a vibrator element.

2. Related Art

JP-A-2013-175933 discloses a method for forming a tuning fork type vibrator having a bottomed groove in a vibration arm by wet etching and dry etching. In this manufacturing method, a quartz crystal substrate is wet etched to form an outer shape of the tuning fork type vibrator, and then the groove is formed by dry etching.

JP-A-2007-013382 discloses a method for forming a tuning fork type vibrator having a bottomed groove in a vibration arm by dry etching. In this manufacturing method, when a substrate made of a piezoelectric material is dry etched, a width of the groove is narrowed relative to a width between a pair of vibration arms, thereby using a micro loading effect to make an etching depth of the groove smaller than an etching depth between the pair of vibration arms, the groove and an outer shape of the vibrator are collectively formed.

In the manufacturing method disclosed in JP-A-2013-175933, since wet etching for forming the outer shape and dry etching for forming the groove are separate steps, manufacturing steps are complicated, and misalignment of the groove relative to the outer shape is likely to occur. Therefore, there is a problem in that a vibrator element manufactured by this manufacturing method is likely to generate an unnecessary vibration.

On the other hand, in the manufacturing method disclosed in JP-A-2007-013382, since the outer shape and the groove are collectively formed in the same step, the above-described problem does not occur. However, in this manufacturing method, since the outer shape and the groove are collectively formed using the micro loading effect in dry etching, there is a problem in that setting of a dimension such as a width of the vibration arm and a width and a depth of the groove is restricted, which leads to a low degree of freedom in design.

Therefore, there is a demand for a method for manufacturing a vibrator element in which an outer shape and a groove can be collectively formed and that has a high degree of freedom in design.

SUMMARY

A method for manufacturing a vibrator element which includes a first vibration arm and a second vibration arm that extend along a first direction and that are arranged side by side along a second direction intersecting the first direction, and in which the first vibration arm and the second vibration arm each have a first surface and a second surface that are arranged side by side in a third direction intersecting the first direction and the second direction and that are in a front and back relationship, a bottomed first groove that opens to the first surface, and a bottomed second groove that opens to the second surface, includes: a preparation step of preparing a quartz crystal substrate having a first substrate surface and a second substrate surface that are in a front and back relationship; a first protective film forming step of forming a first protective film on the first substrate surface; a first dry etching step of dry etching the quartz crystal substrate from a first substrate surface side via the first protective film to form the first surface, the first groove, and outer shapes of the first vibration arm and the second vibration arm; a second protective film forming step of forming a second protective film on the second substrate surface; and a second dry etching step of dry etching the quartz crystal substrate from a second substrate surface side via the second protective film to form the second surface and the second groove, the outer shapes of the first vibration arm and the second vibration arm are formed from the first surface to the second surface in the first dry etching step, and the outer shapes of the first vibration arm and the second vibration arm are not formed in the second dry etching step.

BRIEF DESCRIPTION OF THE DRAWINGS

FIG. 29 is a cross sectional view showing a method for forming a second protective film.

FIG. 30 is a cross sectional view showing the method for forming the second protective film.

DESCRIPTION OF EXEMPLARY EMBODIMENTS

Next, embodiments of the present disclosure will be described with reference to the drawings.

For convenience of description, in drawings except for FIGS. 3, 6, 10, 18, and 28, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". In addition, an arrow tip side in each axial direction is referred to as a "positive side", and an arrow base end side is referred to as a "negative side". For example, the Y direction refers to both the positive side in the Y direction and the negative side in the Y direction. A positive side in the Z direction is referred to as "upper", and a negative side in the Z direction is referred to as "lower". A plan view from the Z direction is also simply referred to as a "plan view". A thickness along the Z direction is also simply referred to as a "thickness". The Y direction is also referred to as a "first direction", the X direction is also referred to as a "second direction", and the Z direction is also referred to as a "third direction". In the present embodiment, the X axis, the Y axis, and the Z axis correspond to crystallographic axes of quartz crystal which will be described later.

1. First Embodiment

A method for manufacturing a vibrator element 1 according to a first embodiment will be described.

First, a configuration of the vibrator element 1 will be described with reference to FIGS. 1 and 2, and then a method for manufacturing the vibrator element 1 will be described with reference to FIGS. 3 to 15.

Figure 1:
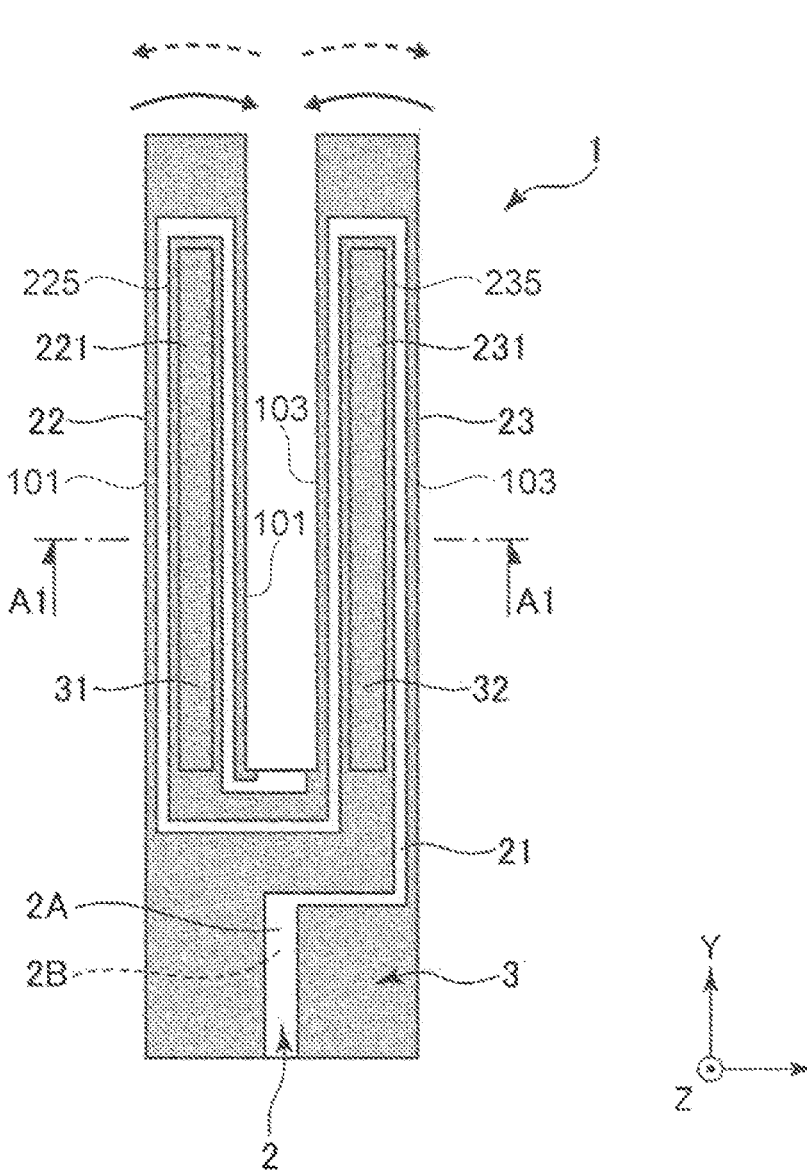
FIG. 1 is a plan view showing a vibrator element according to a first embodiment.
Figure 1:
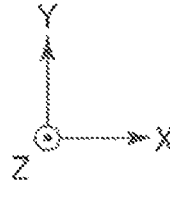
Figure 2:
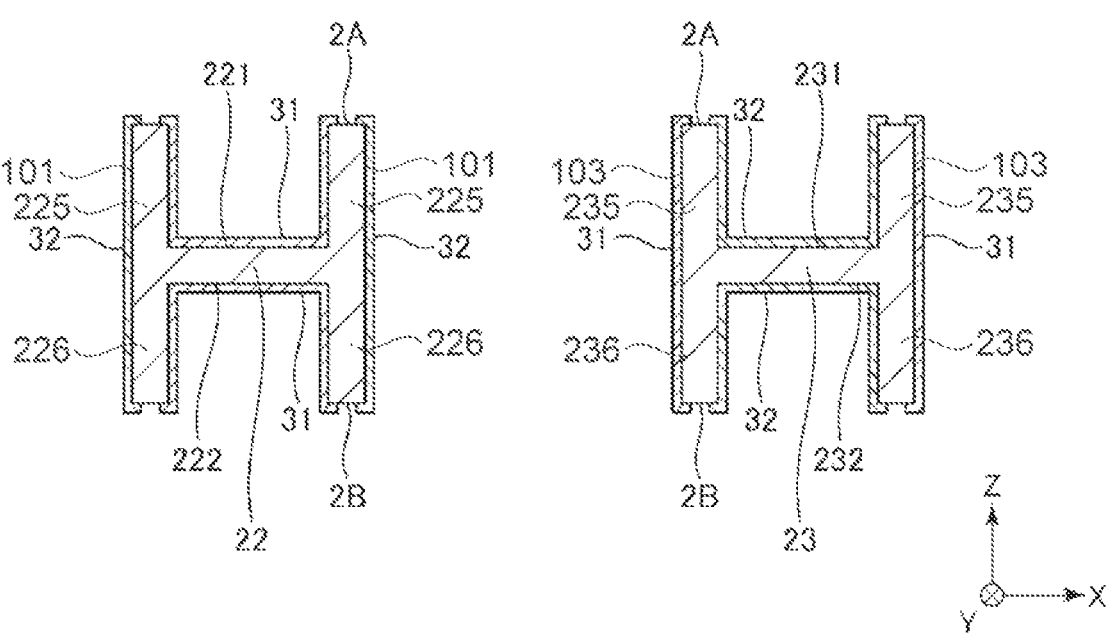
FIG. 2 is a cross sectional view taken along a line A1-A1 in FIG. 1.

As shown in FIGS. 1 and 2, the vibrator element 1 is a tuning fork type vibrator element, and includes a vibration substrate 2 and an electrode 3 formed on a surface of the vibration substrate 2.

The vibration substrate 2 is formed by patterning a Z-cut quartz crystal substrate serving as a Z-cut quartz crystal substrate into a desired shape. The vibration substrate 2 has a width in an X-Y plane defined by the X axis and the Y axis which are crystallographic axes of the quartz crystal, and has a thickness along the Z direction. The X axis is also referred to as an electrical axis, the Y axis is also referred to as a mechanical axis, and the Z axis is also referred to as an optical axis.

The vibration substrate 2 has a plate shape and has a first surface 2A and a second surface 2B that are in a front and back relationship relative to each other and are arranged along the Z direction. The vibration substrate 2 includes a base portion 21, and a first vibration arm 22 and a second vibration arm 23 that extend from the base portion 21 along the Y direction and are arranged side by side along the X direction.

The first vibration arm 22 includes a bottomed first groove 221 that opens to the first surface 2A, a first bank portion 225 that defines the first groove 221, a bottomed second groove 222 that opens to the second surface 2B, a second bank portion 226 that defines the second groove 222, and a side surface 101 that couples the first surface 2A and the second surface 2B. The first bank portion 225 is a portion that sandwiches the first groove 221 along the X direction on the first surface 2A in a plan view. The second bank portion 226 is a portion that sandwiches the second groove 222 along the X direction on the second surface 2B in a plan view.

The second vibration arm 23 includes a bottomed first groove 231 that opens to the first surface 2A, a first bank portion 235 that defines the first groove 231, a bottomed second groove 232 that opens to the second surface 2B, a second bank portion 236 that defines the second groove 232, and a side surface 103 that couples the first surface 2A and the second surface 2B. The first bank portion 235 is a portion that sandwiches the first groove 231 along the X direction on the first surface 2A in a plan view. The second bank portion 236 is a portion that sandwiches the second groove 232 along the X direction on the second surface 2B in a plan view.

The first grooves 221 and 231 and the second grooves 222 and 232 extend along the Y direction. The first bank portions 225 and 235 are respectively formed on both sides of the first grooves 221 and 231 in the X direction, and extend along the Y direction. The second bank portions 226 and 236 are respectively formed on both sides of the second grooves 222 and 232 in the X direction, and extend along the Y direction. Therefore, the first vibration arm 22 and the second vibration arm 23 have a substantially H-shaped cross sectional shape. As a result, a thermoelastic loss is reduced, and the vibrator element 1 has an excellent vibration property.

The electrode 3 includes signal electrodes 31 and ground electrodes 32. The signal electrodes 31 are disposed on the first surface 2A and the second surface 2B of the first vibration arm 22 and the side surface 103 of the second vibration arm 23. On the other hand, the ground electrodes 32 are disposed on the side surface 101 of the first vibration arm 22 and the first surface 2A and the second surface 2B of the second vibration arm 23. When a drive signal is applied to the signal electrodes 31 in a state in which the ground electrodes 32 are grounded, the first vibration arm 22 and the second vibration arm 23 perform a flexural vibration in the X direction so as to repeatedly come close to and separate from each other, as shown by arrows in FIG. 1.

The vibrator element 1 is briefly described above.

Next, a method for manufacturing the vibrator element 1 will be described.

Figure 3:
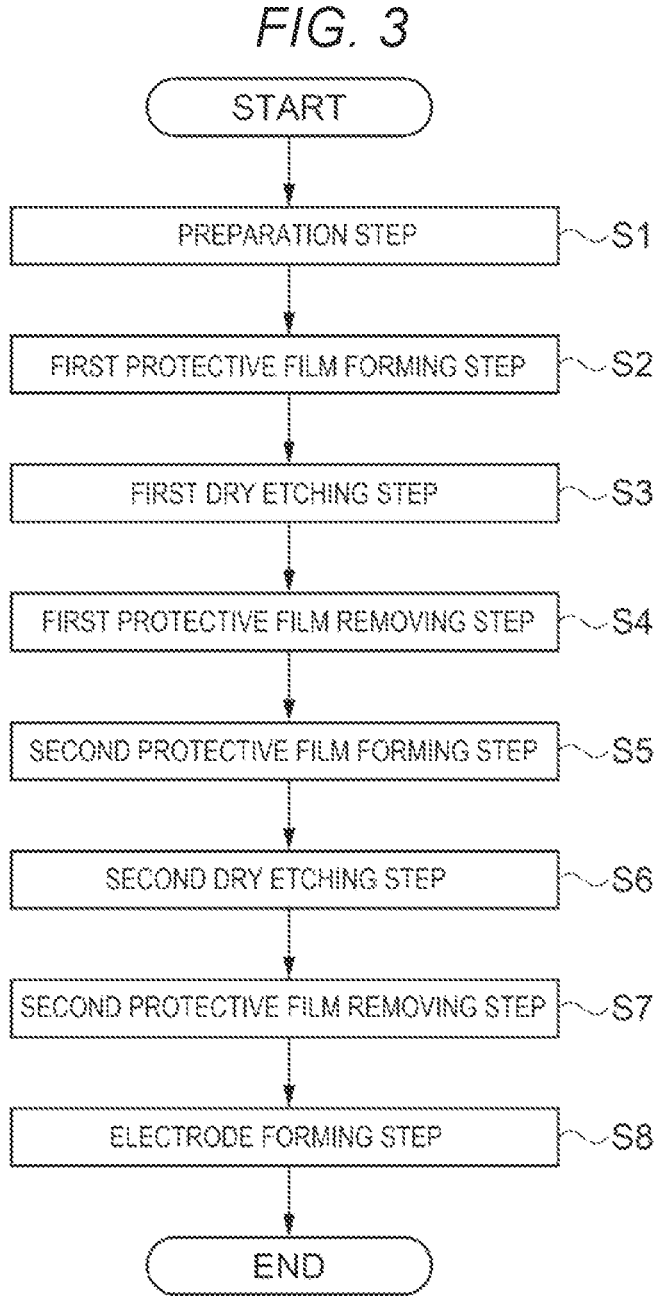
FIG. 3 is a diagram showing steps of manufacturing the vibrator element according to the first embodiment.

As shown in FIG. 3, the method for manufacturing the vibrator element 1 includes: a preparation step S1 of preparing a quartz crystal substrate 20 which is a base material of the vibration substrate 2, a first protective film forming step S2 of forming a first protective film 5 on a first substrate surface 20A of the quartz crystal substrate 20, a first dry etching step S3 of dry etching the quartz crystal substrate 20 from a first substrate surface 20A side via the first protective film 5, a first protective film removing step S4 of removing the first protective film 5 remaining on the first substrate surface 20A of the quartz crystal substrate 20, a second protective film forming step S5 of forming a second protective film 6 on a second substrate surface 20B of the quartz crystal substrate 20, a second dry etching step S6 of dry etching the quartz crystal substrate 20 from a second substrate surface 20B side via the second protective film 6, a second protective film removing step S7 of removing the second protective film 6 remaining on the second substrate surface 20B of the quartz crystal substrate 20, and an electrode forming step S8 of forming the electrode 3 on a surface of the vibration substrate 2 obtained by the above steps.

In the present embodiment, the outer shapes of the first vibration arm 22 and the second vibration arm 23 are formed from the first surface 2A to the second surface 2B in the first dry etching step S3, and the outer shapes of the first vibration arm 22 and the second vibration arm 23 are not formed in the second dry etching step S6.

Hereinafter, each step will be described in order.
Preparation Step S1

Figure 4:
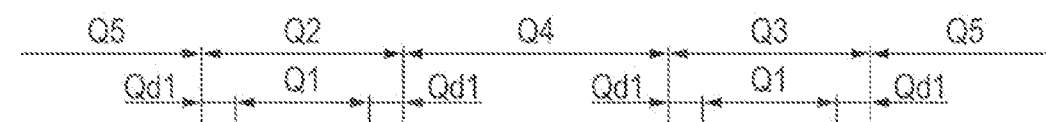
FIG. 4 is a cross sectional view showing a method for manufacturing the vibrator element.
Figure 4:
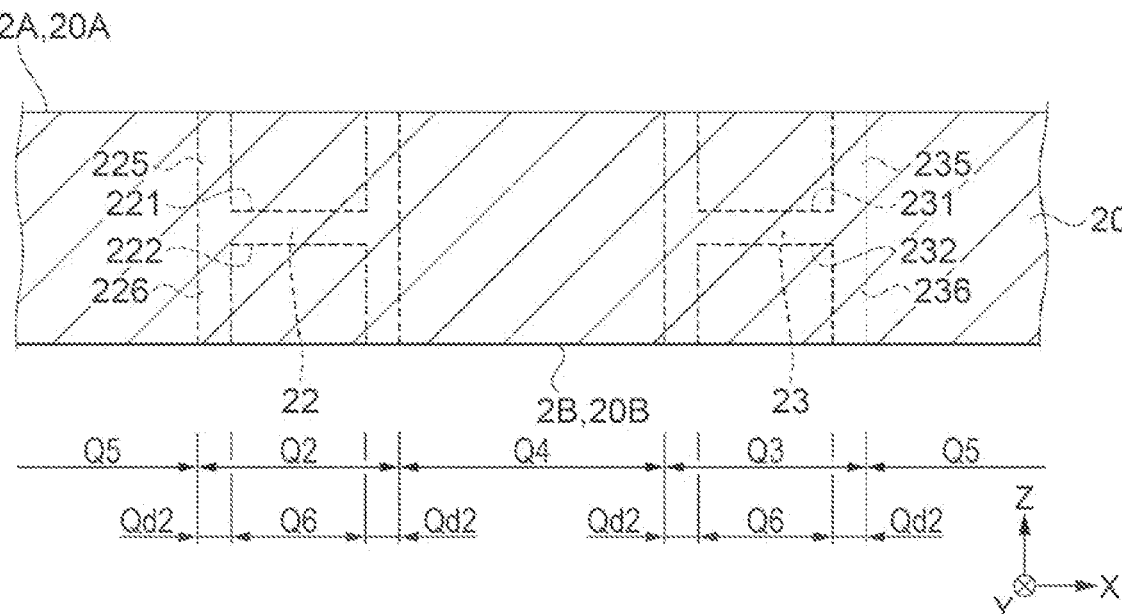

As shown in FIG. 4, the quartz crystal substrate 20 which is the base material of the vibration substrate 2 is prepared. A plurality of vibrator elements 1 are collectively formed from the quartz crystal substrate 20. The quartz crystal substrate 20 is formed in a plate shape, and has the first substrate surface 20A and the second substrate surface 20B that are in a front and back relationship relative to each other and are arranged along the Z direction. In the present embodiment, the first substrate surface 20A is an upper surface of the quartz crystal substrate 20, and the second substrate surface 20B is a lower surface of the quartz crystal substrate 20.

The quartz crystal substrate 20 is adjusted to have a desired thickness by a polishing treatment such as lapping or polishing, and the first substrate surface 20A and the second substrate surface 20B are sufficiently smoothed. The quartz crystal substrate 20 may be subjected to a surface treatment by wet etching as needed.

In the present embodiment, the first substrate surface 20A of the quartz crystal substrate 20 becomes the first surface 2A of the first vibration arm 22 and the second vibration arm 23, and the second substrate surface 20B of the quartz crystal substrate 20 becomes the second surface 2B of the first vibration arm 22 and the second vibration arm 23.

Hereinafter, a region in which the first vibration arm 22 is formed is referred to as a first vibration arm forming region Q2. A region in which the second vibration arm 23 is formed is referred to as a second vibration arm forming region Q3. A region located between the first vibration arm forming region Q2 and the second vibration arm forming region Q3 is referred to as an inter-arm region Q4. In addition, a region located between adjacent vibration substrates 2 is referred to as an inter-element region Q5.

The first vibration arm forming region Q2 and the second vibration arm forming region Q3 include respective first groove forming regions Q1 in which the respective first grooves 221 and 231 are formed, and respective first bank portion forming regions Qd1 in which the respective first bank portions 225 and 235 are formed. In other words, the first bank portion forming regions Qd1 correspond to regions of the first vibration arm forming region Q2 and the second vibration arm forming region Q3 excluding the first groove forming regions Q1.

The first vibration arm forming region Q2 and the second vibration arm forming region Q3 include respective second groove forming regions Q6 in which the respective second grooves 222 and 232 are formed and second bank portion forming regions Qd2 in which the respective second bank portions 226 and 236 are formed. In other words, the second bank portion forming regions Qd2 correspond to regions of the first vibration arm forming region Q2 and the second vibration arm forming region Q3 excluding the second groove forming regions Q6.
First Protective Film Forming Step S2

Figure 5:
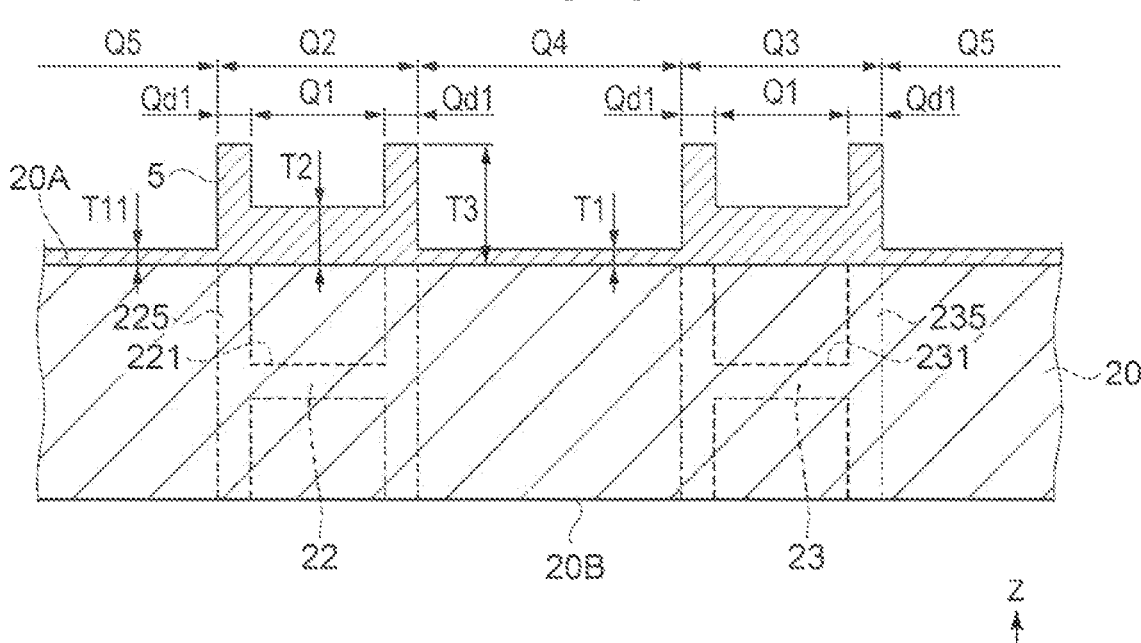
FIG. 5 is a cross sectional view showing the method for manufacturing the vibrator element.

As shown in FIG. 5, the first protective film 5 is formed on the first substrate surface 20A of the quartz crystal substrate 20.

The first protective film 5 includes a region in which the first protective film 5 has a small thickness along the Z direction and a region in which the first protective film 5 has a large thickness along the Z direction. The first protective film 5 is made of a material that is etched at a predetermined etching rate in the first dry etching step S3 to be described later.

The quartz crystal substrate 20 is etched from the first substrate surface 20A side of the quartz crystal substrate 20 via the first protective film 5 in the first dry etching step S3 to be described later. That is, etching of the first substrate surface 20A of the quartz crystal substrate 20 is started after the first protective film 5 is removed. Therefore, etching of the quartz crystal substrate 20 in the region in which the thickness of the first protective film 5 is small is started earlier than etching of the quartz crystal substrate 20 in the region in which the thickness of the first protective film 5 is large, so that an etching depth is large. On the other hand, etching of the quartz crystal substrate 20 in the region in which the thickness of the first protective film 5 is large is started later than etching of the quartz crystal substrate 20 in the region in which the thickness of the first protective film 5 is small, so that an etching depth of the quartz crystal substrate 20 is small. In this manner, the etching depth of the quartz crystal substrate 20 can be controlled by adjusting the thickness of the first protective film 5.

The first protective film 5 is formed in the first vibration arm forming region Q2, the second vibration arm forming region Q3, the inter-arm region Q4, and the inter-element region Q5 of the first substrate surface 20A.

Thicknesses of the first protective film 5 along the Z direction satisfy $T1 < T2 < T3$ in which a thickness of the first protective film 5 along the Z direction in the inter-arm region Q4 is defined as T1, a thickness of the first protective film

5 along the Z direction in the first groove forming region Q1 is defined as T2, and a thickness of the first protective film 5 along the Z direction in the first bank portion forming region Qd1 is defined as T3.

Since the first protective film 5 is formed such that the thicknesses of the first protective film 5 satisfy T1<T2<T3, the etching depth of the quartz crystal substrate 20 in the inter-arm region Q4 is larger than the etching depth of the quartz crystal substrate 20 in the first groove forming region Q1 in the first dry etching step S3 to be described later. The etching depth of the quartz crystal substrate 20 in the first groove forming region Q1 is larger than the etching depth of the quartz crystal substrate 20 in the first bank portion forming region Qd1.

In addition, the thicknesses of the first protective film 5 along the Z direction satisfy T11<T2<T3 in which a thickness of the first protective film 5 along the Z direction in the inter-element region Q5 is defined as T11.

Since the first protective film 5 is formed such that the thicknesses of the first protective film 5 satisfy T11<T2<T3, the etching depth of the quartz crystal substrate 20 in the inter-element region Q5 is larger than the etching depth of the quartz crystal substrate 20 in the first groove forming region Q1 in the first dry etching step S3 to be described later.

In the present embodiment, the first protective film 5 in the inter-element region Q5 is formed in a similar manner to the first protective film 5 in the inter-arm region Q4. Therefore, the thickness T11 of the first protective film 5 in the inter-element region Q5 is substantially equal to the thickness T1 of the first protective film 5 in the inter-arm region Q4.

The expression "substantially equal to" is a concept including a case where values are not strictly equal to each other due to variations in manufacturing conditions and the like.

A method for forming the first protective film 5 will be described.

Figure 6:
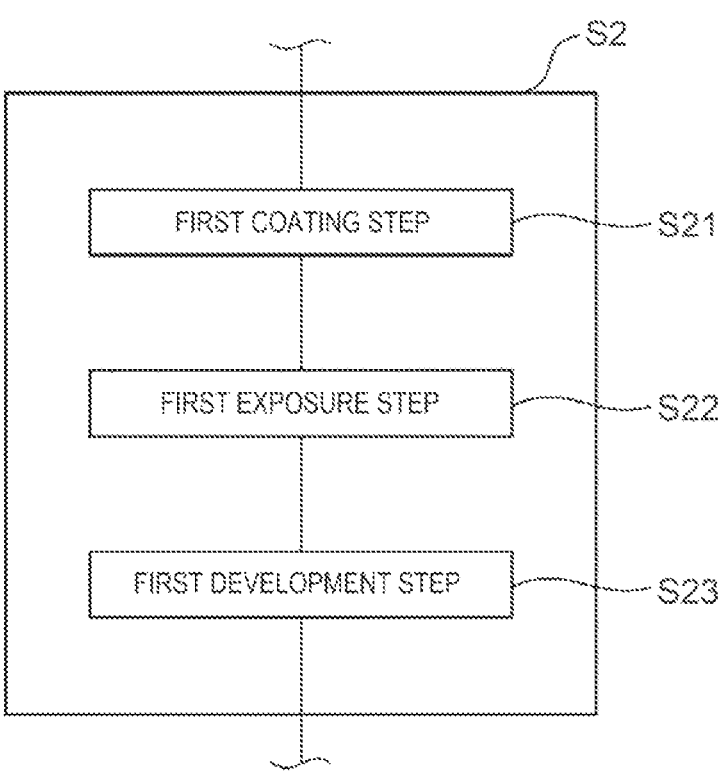
FIG. 6 is a diagram showing a first protective film forming step.

As shown in FIG. 6, the first protective film forming step S2 includes a first coating step S21 of coating a resist material to the first substrate surface 20A of the quartz crystal substrate 20 to form a resist film, a first exposure step S22 of exposing the resist film formed on the first substrate surface 20A, and a first development step S23 of developing the resist film formed on the first substrate surface 20A in the present embodiment.

Figure 7:
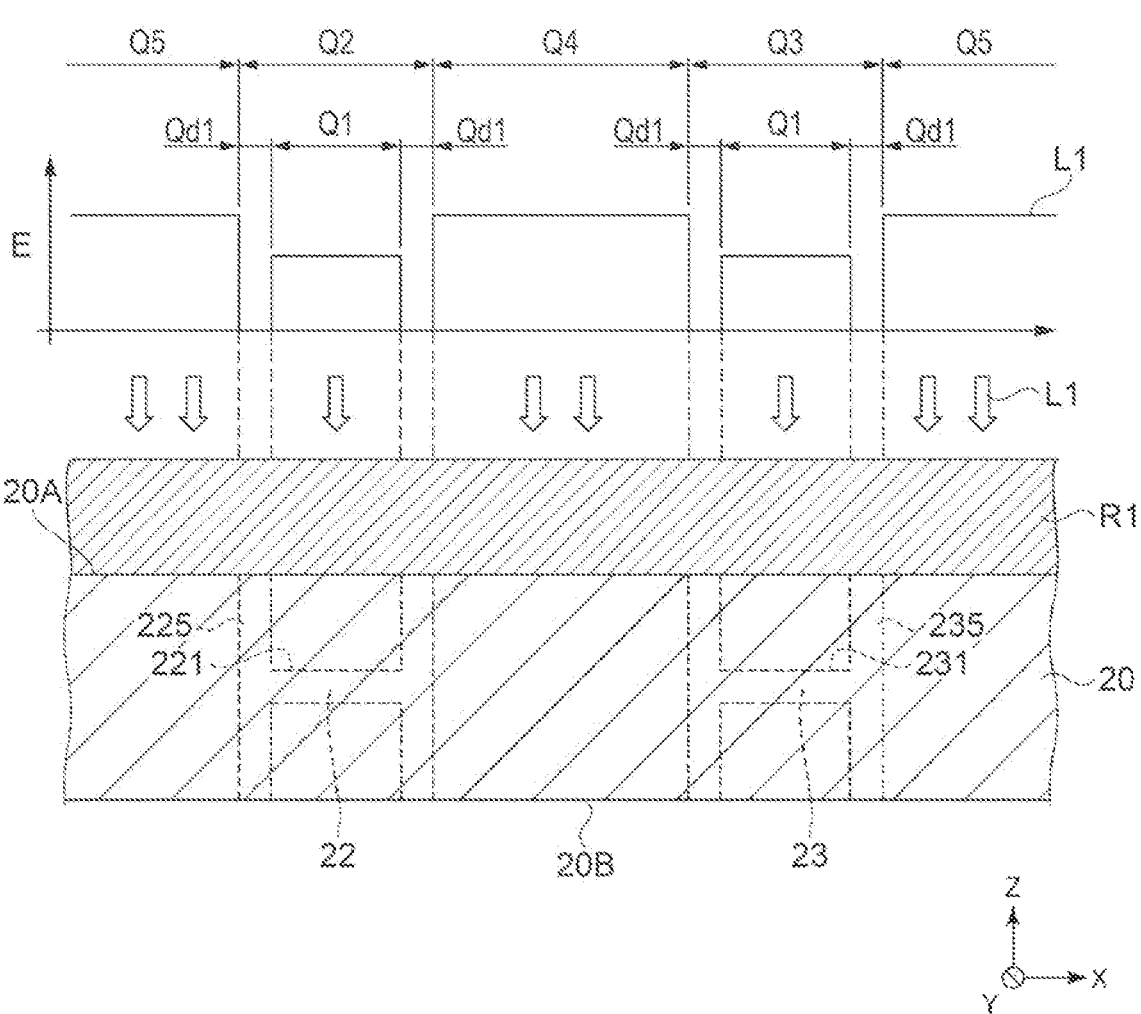
FIG. 7 is a cross sectional view showing a method for forming a first protective film.

As shown in FIG. 7, a first resist film R1 is formed on the first substrate surface 20A of the quartz crystal substrate 20 in the first coating step S21. The first resist film R1 is a resist film made of a resist material. The first resist film R1 is formed by coating a resist material on the first substrate surface 20A at a predetermined thickness. Examples of a method for coating the resist material can include a spin coating method, a spray coating method, or the like.

In the present embodiment, the resist material is a positive photoresist. The resist material may be a negative resist material.

Next, the first resist film R1 formed on the first substrate surface 20A is irradiated with electromagnetic waves L1 in the first exposure step S22. The first resist film R1 is irradiated with the electromagnetic waves L1 at an exposure intensity E corresponding to each of the inter-arm region Q4, the first groove forming region Q1, the first bank portion forming region Qd1, and the inter-element region Q5. FIG. 7 shows an example of a distribution of the exposure intensity E of the electromagnetic waves L1 in the X direction. The exposure intensity E of the electromagnetic waves L1 can be changed using a filter, a gray scale mask, or the like.

Next, the first resist film R1 formed on the first substrate surface 20A is developed in the first development step S23. The thickness of the first protective film 5 corresponds to the exposure intensity E of the electromagnetic waves L1 emitted to the first resist film R1 in the first exposure step S22.

In this manner, the first protective film 5 shown in FIG. 5 is formed.

In the present embodiment, the first protective film 5 is formed of the first resist film R1. Therefore, the first protective film 5 can be easily formed.

The method for forming the first protective film 5 is not limited to the method described above. For example, the first protective film 5 may be formed using a printing technique such as an imprint method.

The first protective film 5 is not limited to a resist film made of a resist material. For example, the first protective film 5 may be a metal film made of a metal such as nickel, copper, or chromium. Such a metal film can be formed by, for example, a plating method. In general, an etching rate of a metal is lower than an etching rate of a photoresist used for a resist material. Therefore, in a case where the first protective film 5 is formed of a metal film, the thickness of the first protective film 5 can be made smaller than the thickness of the first protective film 5 formed of a resist film. Accordingly, dimensional accuracy of the first and second vibration arms 22 and 23, the first grooves 221 and 231, and the like formed in the first dry etching step S3 can be improved.

First Dry Etching Step S3

Figure 8:
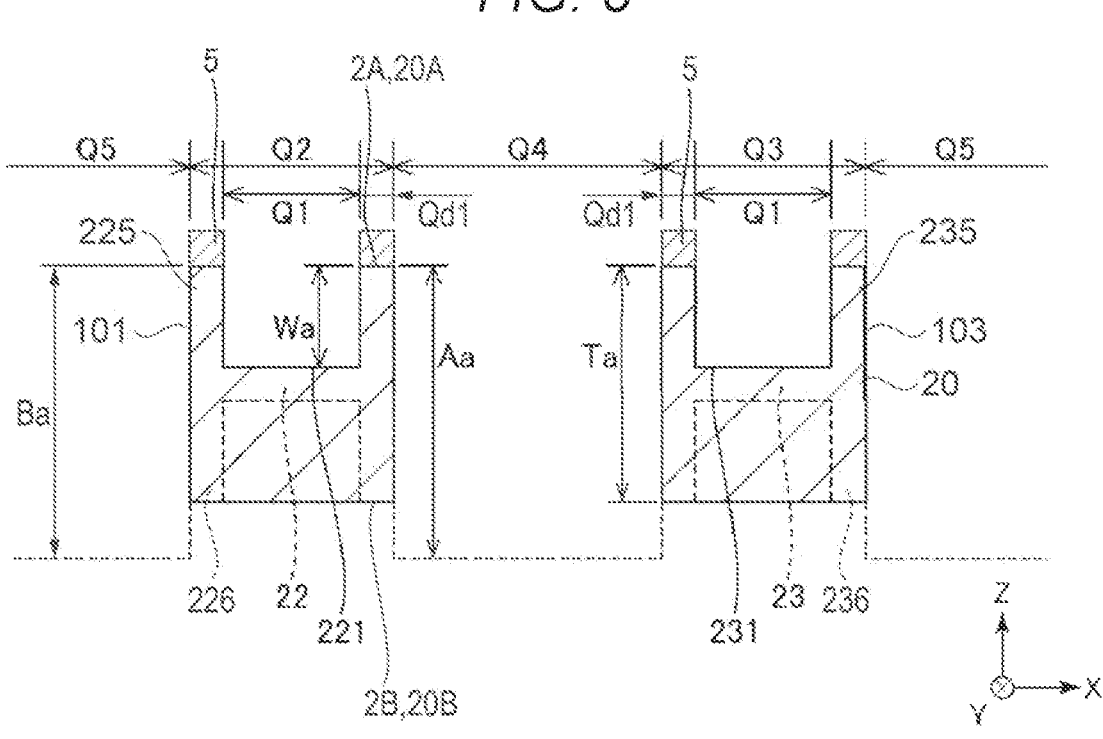
FIG. 8 is a cross sectional view showing the method for manufacturing the vibrator element.

As shown in FIG. 8, the quartz crystal substrate 20 is dry etched from the first surface 20A side via the first protective film 5, and the first substrate surface 2A, the first grooves 221 and 231, and the outer shapes of the first vibration arm 22 and the second vibration arm 23 are simultaneously formed. The expression "simultaneously formed" refers to that the first surface 2A, the first grooves 221 and 231, and the outer shapes of the first vibration arm 22 and the second vibration arm 23 are collectively formed in one step. That is, the first surface 2A, the first grooves 221 and 231, and the outer shapes of the first vibration arm 22 and the second vibration arm 23 are collectively formed in the first dry etching step S3.

More specifically, the dry etching in this step is reactive ion etching, and is performed using a reactive ion etching device (an RIE device). A reactive gas introduced into the RIE device is not particularly limited, and for example, SF$_6$, CF$_4$, C$_2$F$_4$, C$_2$F$_6$, C$_3$F$_6$, and C$_4$F$_8$ can be used.

The first protective film 5 formed on the first substrate surface 20A of the quartz crystal substrate 20 is etched at a predetermined etching rate in the first dry etching step S3. Then, the first protective film 5 is removed to expose the first substrate surface 20A, and etching of the quartz crystal substrate 20 is started. Therefore, the etching depth of the quartz crystal substrate 20 can be controlled by adjusting the thickness of the first protective film 5. In addition, when the thickness of the first protective film 5 is sufficiently increased, the first dry etching step S3 can be ended in a state in which the first protective film 5 remains on the first substrate surface 20A, and the first substrate surface 20A can be prevented from being etched.

The first dry etching step S3 is ended when the first grooves 221 and 231 have a desired depth. The etching depth of the quartz crystal substrate 20 in the first groove forming region Q1 is a depth Wa of the first grooves 221 and 231. The etching depth of the quartz crystal substrate 20 in the inter-arm region Q4 is a depth Aa. The etching depth of the quartz crystal substrate 20 in the inter-element region Q5 is a depth Ba. The outer shapes of the first vibration arm 22 and the second vibration arm 23 are formed by etching the quartz crystal substrate 20 in the inter-arm region Q4 and the inter-element region Q5.

As described above, the thickness T1 of the first protective film 5 in the inter-arm region Q4 and the thickness T11 of the first protective film 5 in the inter-element region Q5 are smaller than the thickness T2 of the first protective film 5 in the first groove forming region Q1. That is, T1<T2 and T11<T2. Therefore, the etching depths Aa and Ba of the quartz crystal substrate 20 in the inter-arm region Q4 and the inter-element region Q5 are larger than the depth Wa of the first grooves 221 and 231. That is, Wa<Aa and Wa<Ba.

As described above, the thickness T2 of the first protective film 5 in the first groove forming region Q1 is smaller than the thickness T3 of the first protective film 5 in the first bank portion forming region Qd1. That is, T2<T3. Therefore, the depth Wa of the first grooves 221 and 231 is larger than the etching depth of the quartz crystal substrate 20 in the first bank portion forming region Qd1.

As described above, in the first dry etching step S3, the quartz crystal substrate 20 is dry etched from the first substrate surface 20A side via the first protective film 5, so that outer shapes of the first and second vibration arms 22 and 23 and the first grooves 221 and 231 can be collectively formed.

Since the dry etching can be performed without being affected by a crystal plane of the quartz crystal, the first grooves 221 and 231 and the outer shape of the vibration substrate 2 can be formed with excellent dimensional accuracy.

It is possible to reduce manufacturing steps of the vibrator element 1 and reduce the cost of the vibrator element 1 by collectively forming the first grooves 221 and 231 and the outer shape of the vibration substrate 2. In addition, since a positional deviation of the first grooves 221 and 231 relative to the outer shape is prevented, it is possible to improve formation accuracy of the vibration substrate 2.

Since the first protective film 5 is formed such that the thicknesses of the first protective film 5 satisfy T1<T2<T3 and T11<T2<T3, the outer shapes of the first and second vibration arms 22 and 23 and the first grooves 221 and 231 can be collectively formed without using a micro loading effect in the first dry etching step S3.

Since the micro loading effect is not used, there is no restriction on the setting of dimensions such as a width of the inter-arm region Q4, a width of the inter-element region Q5, and widths of the first grooves 221 and 231, and it is possible to improve the degree of freedom in designing the vibrator element 1. For example, in the first protective film forming step S2, dimensions of the first grooves 221 and 231 and the outer shapes of the first and second vibration arms 22 and 23 can be controlled by adjusting the thickness and the width of the first protective film 5.

In addition, since the micro loading effect is not used, there is less restriction on a dry etching condition such as the selection of a reactive gas used in the dry etching, and thus the vibrator element 1 can be easily manufactured as compared with a case where the micro loading effect is used.

In the present embodiment, the etching depths Aa and Ba of the quartz crystal substrate 20 in the inter-arm region Q4 and the inter-element region Q5 are equal to or larger than the thickness Ta of the quartz crystal substrate 20. That is, Aa≥Ta and Ba≥Ta.

By setting the etching depths Aa and Ba of the quartz crystal substrate 20 in the inter-arm region Q4 and the inter-element region Q5 to be equal to or larger than the thickness Ta of the crystal substrate 20, the entire quartz crystal substrate 20 in the inter-arm region Q4 and the inter-element region Q5 in a thickness direction of the quartz crystal substrate 20 is removed by etching. That is, the quartz crystal substrate 20 in the inter-arm region Q4 and the inter-element region Q5 is entirely removed from the first substrate surface 20A to the second substrate surface 20B, and the inter-arm region Q4 and the inter-element region Q5 are penetrated.

In this manner, the outer shapes of the first vibration arm 22 and the second vibration arm 23 are formed from the first substrate surface 20A serving as the first surface 2A of the first vibration arm 22 and the second vibration arm 23 to the second substrate surface 20B serving as the second surface 2B of the first vibration arm 22 and the second vibration arm 23 in the first dry etching step S3. That is, the outer shapes of the first vibration arm 22 and the second vibration arm 23 are formed over the entire thickness direction of the first vibration arm 22 and the second vibration arm 23 in the first dry etching step S3. In other words, the side surface 101 of the first vibration arm 22 and the side surface 103 of the second vibration arm 23 are formed in the first dry etching step S3.

Since the outer shapes of the first vibration arm 22 and the second vibration arm 23 are formed from the first surface 2A of the first vibration arm 22 and the second vibration arm 23 to the second surface 2B of the first vibration arm 22 and the second vibration arm 23 in the first dry etching step S3, it is not necessary to form the outer shapes of the first vibration arm 22 and the second vibration arm 23 in the second dry etching step S6 to be described later.

In the present embodiment, the thickness T1 of the first protective film 5 in the inter-arm region Q4 and the thickness T11 of the first protective film 5 in the inter-element region Q5 satisfy 0<T1 and 0<T11.

By setting 0<T1 and 0<T11, even when the thickness of the first resist film R1 varies, a difference between the etching depths Aa and Ba of the quartz crystal substrate 20 in the inter-arm region Q4 and the inter-element region Q5 and the depth Wa of the first grooves 221 and 231 can be made substantially constant.

The thicknesses T1 and T11 of the first protective film 5 in the inter-arm region Q4 and the inter-element region Q5 and the thickness T2 of the first protective film 5 in the first groove forming region Q1 vary depending on a variation in the thickness of the first resist film R1. However, since 0<T1 and 0<T11, the difference between the thicknesses T1 and T11 of the first protective film 5 in the inter-arm region Q4 and the inter-element region Q5 and the thickness T2 of the first protective film 5 in the first groove forming region Q1 is kept substantially constant. That is, a time difference between a time when the etching of the quartz crystal substrate 20 is started in the inter-arm region Q4 and the inter-element region Q5 and a time when the etching of the quartz crystal substrate 20 is started in the first groove forming region Q1 is substantially constant. Therefore, the difference between the etching depths Aa and Ba of the quartz crystal substrate 20 in the inter-arm region Q4 and the inter-element region Q5 and the depth Wa of the first grooves 221 and 231 can be made substantially constant.

In the present embodiment, the dry etching is ended in a state in which the first protective film 5 remains in the first bank portion forming region Qd1 of the first substrate surface 20A in the first dry etching step S3 by sufficiently increasing the thickness T3 of the first protective film 5 in the first bank portion forming region Qd1. That is, the first bank portion forming region Qd1 of the first substrate surface 20A is protected by the first protective film 5, and is not etched in the first dry etching step S3. The first bank portion forming region Qd1 of the first substrate surface 20A becomes the first surfaces 2A of the first and second vibration arms 22 and 23 in the first protective film removing step S4 to be described later.

The dry etching may be ended in a state in which the first protective film 5 does not remain in the first bank portion forming region Qd1 of the first substrate surface 20A in the first dry etching step S3 by adjusting the thickness T3 of the first protective film 5 in the first bank portion forming region Qd1. That is, the first bank portion forming region Qd1 of the first substrate surface 20A may be etched in the first dry etching step S3. In this case, the surfaces etched in the first dry etching step S3 become the first surfaces 2A of the first and second vibration arms 22 and 23.

As described above, the first surface 2A can be formed by etching the first bank portion forming region Qd1 of the first substrate surface 20A or by not etching the first bank portion forming region Qd1 of the first substrate surface 20A in the first dry etching step S3.

First Protective Film Removing Step S4

Figure 9:
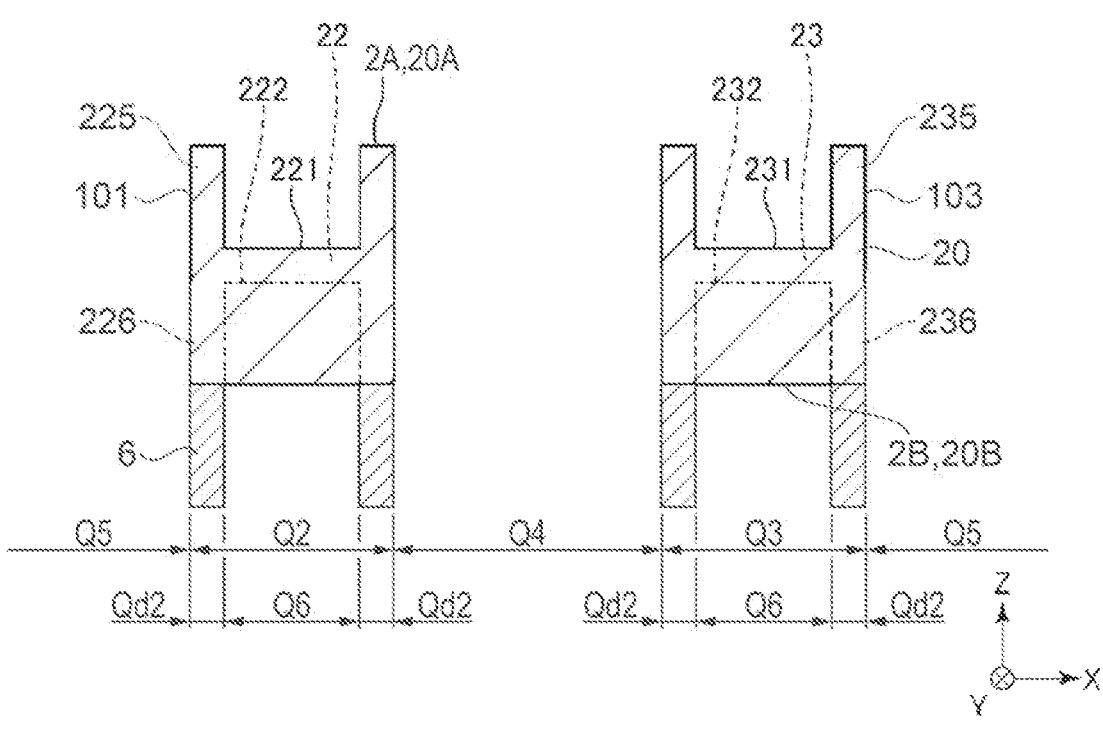
FIG. 9 is a cross sectional view showing the method for manufacturing the vibrator element.

As shown in FIG. 9, the first protective film 5 remaining in the first bank portion forming region Qd1 of the first substrate surface 20A is removed. As a result, the first substrate surface 20A of the quartz crystal substrate 20 becomes the first surfaces 2A of the first and second vibration arms 22 and 23. That is, since the first surfaces 2A of the first and second vibration arms 22 and 23 are not etched in the first dry etching step S3, the thickness of the first and second vibration arms 22 and 23 and a surface roughness of the first surface 2A in the first bank portion forming region Qd1 are maintained as the thickness of the quartz crystal substrate 20 and a surface roughness of the first substrate surface 20A. Therefore, thickness accuracy of the first and second vibration arms 22 and 23 is improved, and an unnecessary vibration such as a torsional vibration is prevented from occurring.

In the first dry etching step S3 described above, when the dry etching is ended in a state in which the first protective film 5 does not remain on the first substrate surface 20A of the quartz crystal substrate 20, the first protective film removing step S4 may not be provided.

After the completion of the first protective film removing step S4, the method proceeds to a processing of the second substrate surface 20B of the quartz crystal substrate 20.

Second Protective Film Forming Step S5

As shown in FIG. 9, the second protective film 6 is formed on the second substrate surface 20B of the quartz crystal substrate 20.

The second protective film 6 is formed on the second substrate surface 20B in a region other than the second groove forming region Q6. In the present embodiment, the second protective film 6 is formed in the second bank portion forming region Qd2 of the second substrate surface 20B.

Since the second protective film 6b is not formed in the second groove forming region Q6 of the second substrate surface 20B, the second grooves 222 and 232 can be formed in the second groove forming region Q6 in the second dry etching step S6 to be described later.

A method for forming the second protective film 6 will be described.

Figure 10:
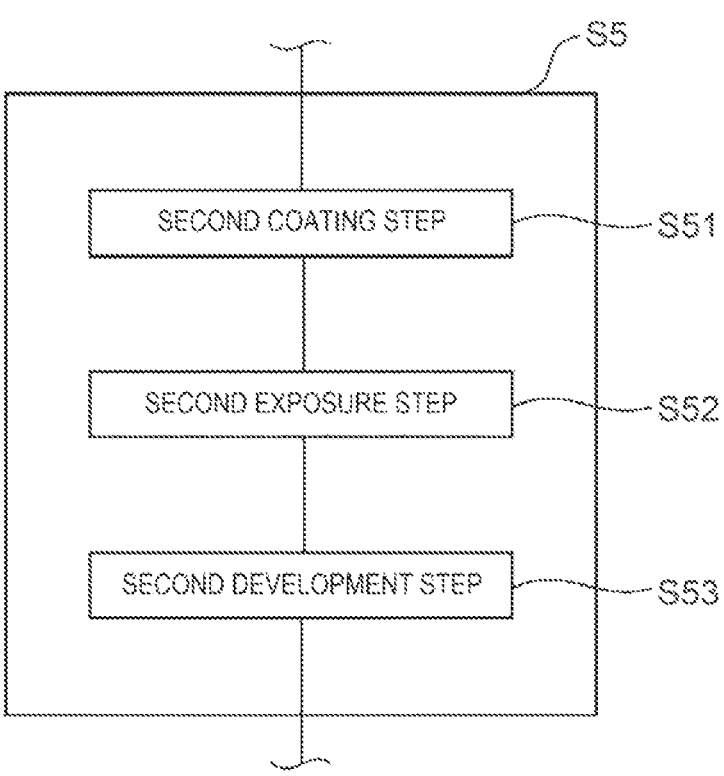
FIG. 10 is a diagram showing a second protective film forming step.

As shown in FIG. 10, the second protective film forming step S5 includes a second coating step S51 of coating a resist material to the second substrate surface 20B of the quartz crystal substrate 20 to form a resist film, a second exposure step S52 of exposing the resist film formed on the second substrate surface 20B, and a second development step S53 of developing the resist film formed on the second substrate surface 20B in the present embodiment.

Figure 11:
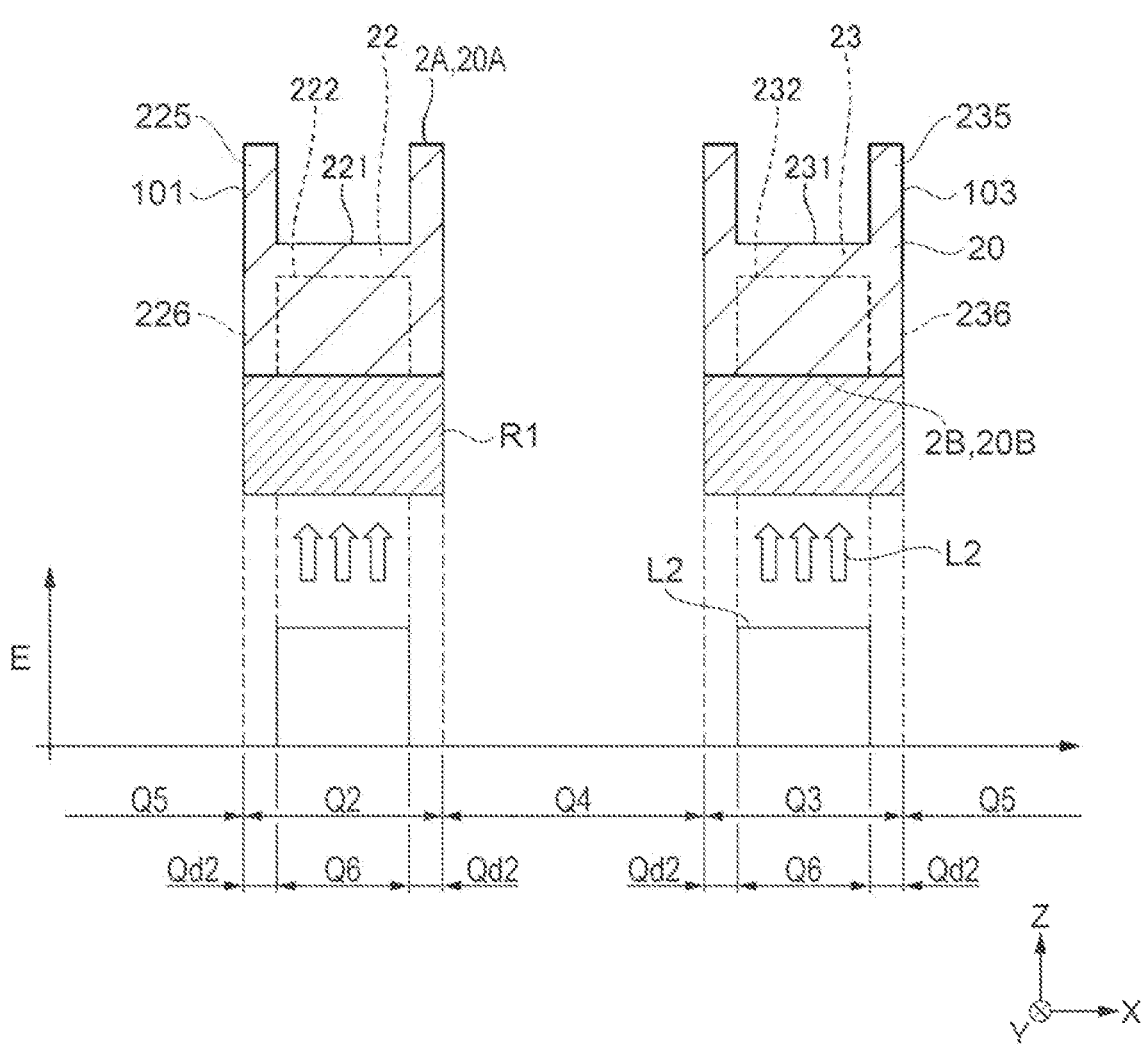
FIG. 11 is a cross sectional view showing a method for forming a second protective film.

As shown in FIG. 11, the first resist film R1 is formed on the second substrate surface 20B of the quartz crystal substrate 20 in the second coating step S51. The second coating step S51 is performed in a similar manner to the first coating step S21.

Next, the first resist film R1 formed on the second substrate surface 20B is irradiated with electromagnetic waves L2 in the second exposure step S52. The electromagnetic waves L2 is emitted so as to remove the first resist film R1 in the second groove forming region Q6 in the second development step S53 to be described later. The electromagnetic waves L2 is emitted such that the first resist film R1 remains in the second bank portion forming region Qd2 in the present embodiment.

Next, the first resist film R1 formed on the second substrate surface 20B is developed in the second development step S53. The second development step S53 is performed in a similar manner to the first development step S23.

In this manner, the second protective film 6 shown in FIG. 9 is formed.

In the present embodiment, the second protective film 6 is formed of the first resist film R1. Therefore, the second protective film 6 can be easily formed.

The method for forming the second protective film 6 is not limited to the method described above. For example, the second protective film 6 may be formed using a printing technique such as an imprint method.

The second protective film 6 is not limited to a resist film made of a resist material. For example, the second protective film 6 may be a metal film made of a metal.

Although the first protective film 5 and the second protective film 6 are resist films in the present embodiment, one of the first protective film 5 and the second protective film 6 may be a resist film and the other one may be a metal film. Both the first protective film 5 and the second protective film 6 may be metal films.

Second Dry Etching Step S6

Figure 12:
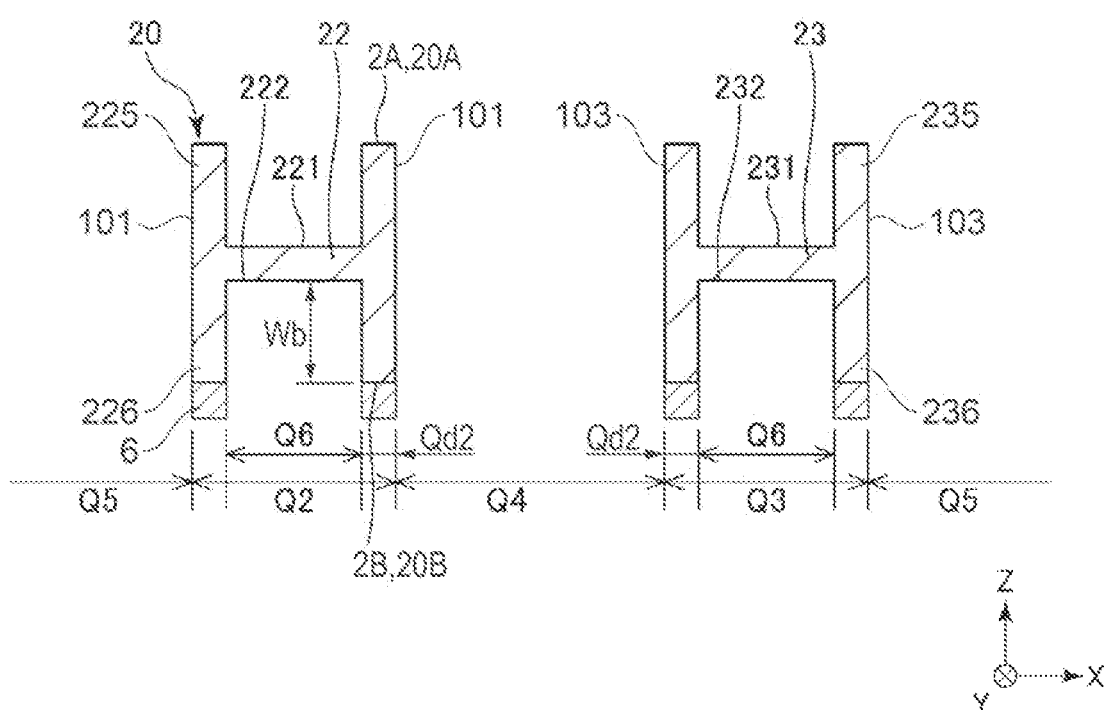
FIG. 12 is a cross sectional view showing the method for manufacturing the vibrator element.

As shown in FIG. 12, the quartz crystal substrate 20 is dry etched from the second substrate surface 20B side via the second protective film 6, and the second surface 2B and the second grooves 222 and 232 are simultaneously formed. That is, the second surface 2B and the second grooves 222 and 232 are collectively formed in the second dry etching step S6. The present step is performed in a similar manner to the first dry etching step S3.

As described above, the second protective film 6 is not formed in the second groove forming region Q6 of the second substrate surface 20B in the second protective film forming step S5. Therefore, the second groove forming region Q6 of the quartz crystal substrate 20 is etched in the second dry etching step S6.

The second dry etching step S6 is ended when the second grooves 222 and 232 have a desired depth. The etching depth of the quartz crystal substrate 20 in the second groove forming region Q6 is the depth Wb of the second grooves 222 and 232.

As described above, the second grooves 222 and 232 can be formed by dry etching the quartz crystal substrate 20 from the second substrate surface 20B side via the second protective film 6 in the second dry etching step S6.

Since the dry etching can be performed without being affected by a crystal plane of the quartz crystal, the second grooves 222 and 232 can be formed with excellent dimensional accuracy.

Since the micro loading effect is not used, there is no restriction on the setting of dimensions such as widths of the second grooves 222 and 232, and it is possible to improve the degree of freedom in designing the vibrator element 1.

In addition, since the micro loading effect is not used, there is less restriction on a dry etching condition, and thus the vibrator element 1 can be easily manufactured.

Figure 13:
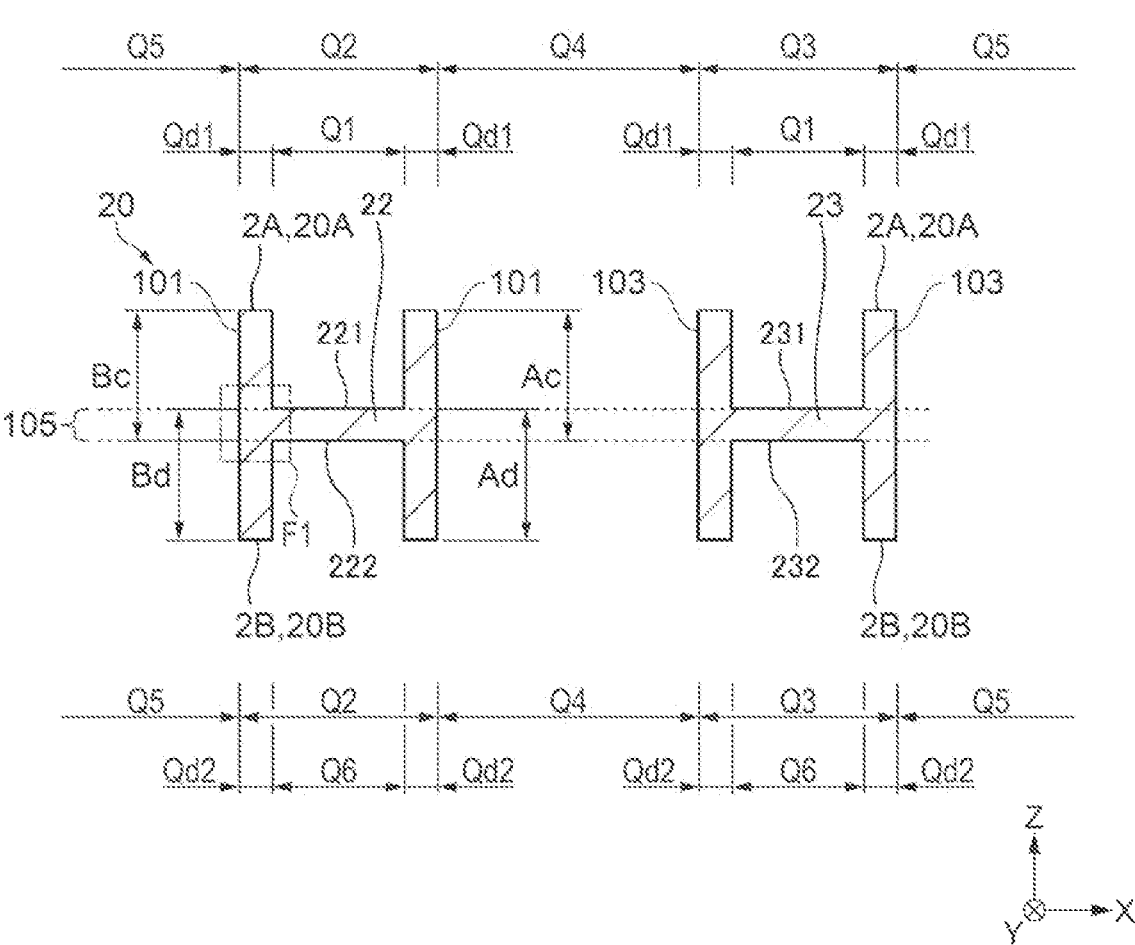
FIG. 13 is a cross sectional view showing a vibrator element in the related art.

In the related art, as shown in FIG. 13, dry etching is performed from the first substrate surface 20A side via a protective film (not shown) provided on the first substrate surface 20A of the quartz crystal substrate 20 to form the outer shapes of the first vibration arm 22 and the second vibration arm 23, and dry etching is performed from the second substrate surface 20B side via a protective film (not shown) provided on the second substrate surface 20B of the quartz crystal substrate 20 to form the outer shapes of the first vibration arm 22 and the second vibration arm 23. An etching depth Ac in the inter-arm region Q4 and an etching depth Bc in the inter-element region Q5 when the dry etching is performed from the first substrate surface 20A side are depths of the outer shapes of the first vibration arm 22 and the second vibration arm 23 when the dry etching is performed from the first substrate surface 20A side. An etching depth Ad in the inter-arm region Q4 and an etching depth Bd in the inter-element region Q5 when the dry etching is performed from the second substrate surface 20B side are depths of the outer shapes of the first vibration arm 22 and the second vibration arm 23 when the dry etching is performed from the second substrate surface 20B side of the quartz crystal substrate 20.

The depths Ac and Bc of the outer shapes of the first vibration arm 22 and the second vibration arm 23 and the depths Ad and Bd of the outer shapes of the first vibration arm 22 and the second vibration arm 23 overlap with one another, so that the quartz crystal substrate 20 in the inter-arm region Q4 and the inter-element region Q5 is penetrated. The side surfaces 101 and 103 of the respective first vibration arm 22 and the second vibration arm 23 are formed by penetrating the quartz crystal substrate 20 in the inter-arm region Q4 and the inter-element region Q5.

Figure 14:
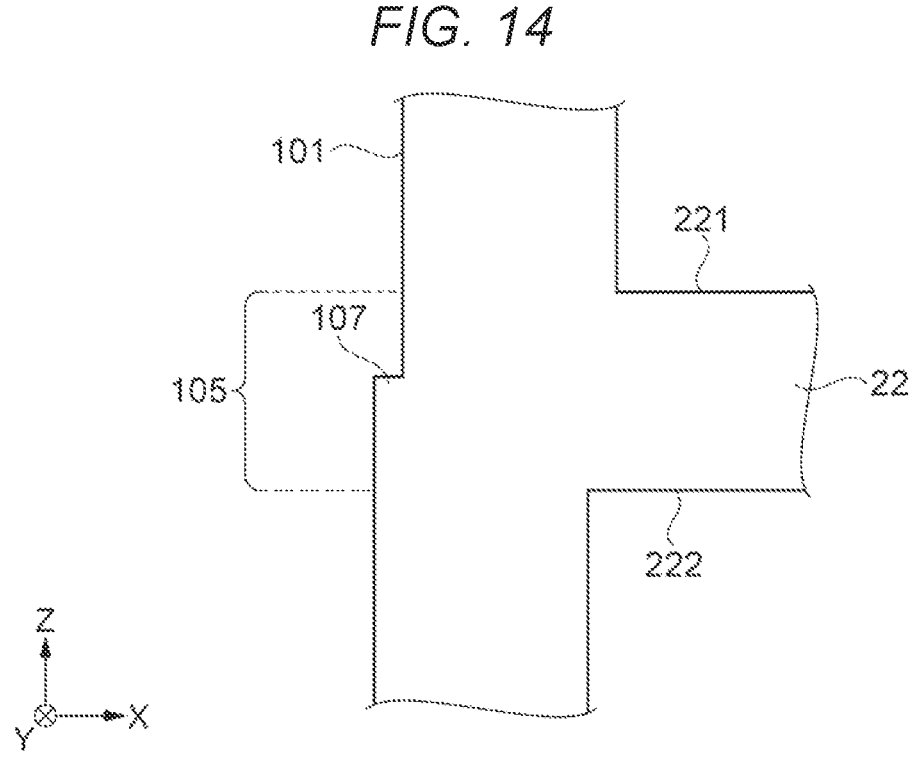
FIG. 14 is a cross sectional view corresponding to a position of an F1 portion shown in FIG. 13.

Therefore, for example, when positions of the protective film provided on the first substrate surface 20A and the protective film provided on the second substrate surface 20B are shifted from each other due to a manufacturing variation or the like in a plan view from the Z direction, as shown in FIG. 14, a step 107 may be formed in a region 105 where the depths Ac and Bc of the outer shapes of the first vibration arm 22 and the second vibration arm 23 and the depths Ad and Bd of the outer shapes of the first vibration arm 22 and the second vibration arm 23 overlap with one another. FIG. 14 shows the side surface 101 of the first vibration arm 22, and the step 107 is formed on the side surface 103 of the second vibration arm 23 in a similar manner.

When the step 107 is formed on the side surfaces 101 and 103 of the first vibration arm 22 and the second vibration arm 23, an unnecessary vibration may occur, or breakage such as cracking or chipping starting from the step 107 may occur when an impact is applied.

On the other hand, in the present embodiment, the outer shapes of the first vibration arm 22 and the second vibration arm 23 are formed from the first surface 2A of the first vibration arm 22 and the second vibration arm 23 to the second surface 2B of the first vibration arm 22 and the second vibration arm 23 in the first dry etching step S3, and the outer shapes of the first vibration arm 22 and the second vibration arm 23 are not formed in the second dry etching step S6. Therefore, the step 107 is not formed on the side surfaces 101 and 103 of the first vibration arm 22 and the second vibration arm 23. Therefore, it is possible to prevent the occurrence of an unnecessary vibration caused by the step 107 and it is possible to prevent the vibrator element 1 from being broken.

In the present embodiment, the dry etching is ended in a state in which the second protective film 6 remains in the second bank portion forming region Qd2 of the second substrate surface 20B in the second dry etching step S6 by sufficiently increasing the thickness of the second protective film 6 in the second bank portion forming region Qd2. That is, the second bank portion forming region Qd2 of the second substrate surface 20B is not etched in the second dry etching step S6. The second bank portion forming region Qd2 of the second substrate surface 20B becomes the second surface 2B of the first and second vibration arms 22 and 23 in the second protective film removing step S7 to be described later.

The dry etching may be ended in a state in which the second protective film 6 remains in the second bank portion forming region Qd2 of the second substrate surface 20B in the second dry etching step S6 by adjusting the thickness of the second protective film 6 in the second bank portion forming region Qd2. That is, the second bank portion forming region Qd2 of the second substrate surface 20B may be etched in the second dry etching step S6. In this case, the surfaces etched in the second dry etching step S6 become the second surfaces 2B of the first and second vibration arms 22 and 23.

As described above, the second surface 2B can be formed by etching the second bank portion forming region Qd2 of the second substrate surface 20B or by not etching the second bank portion forming region Qd2 of the second substrate surface 20B in the second dry etching step S6.

Second Protective Film Removing Step S7

Figure 15:
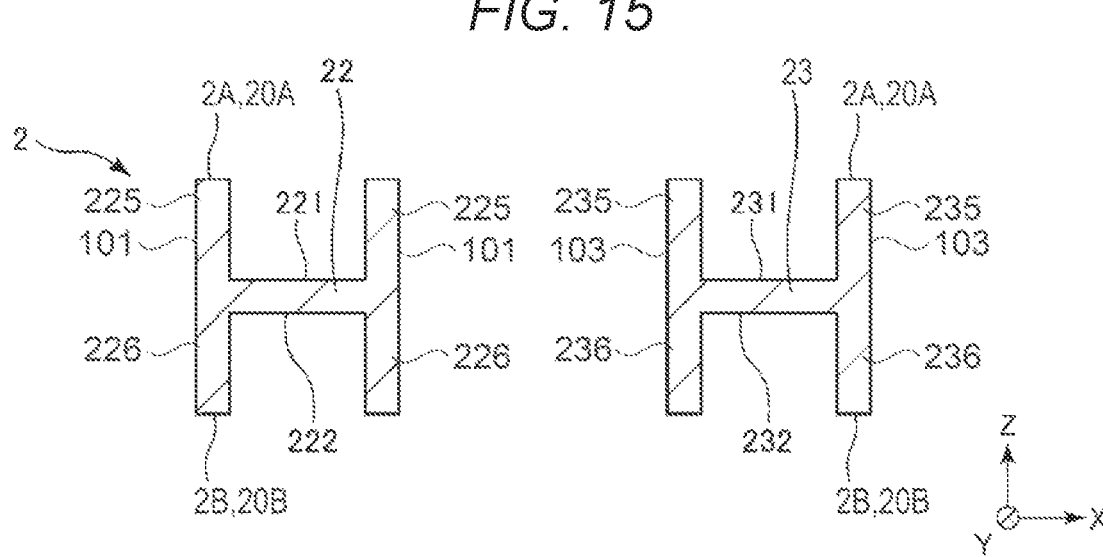
FIG. 15 is a cross sectional view showing the method for manufacturing the vibrator element.

As shown in FIG. 15, the second protective film 6 remaining in the second bank portion forming region Qd2 of the second substrate surface 20B is removed. As a result, the second substrate surface 20B of the quartz crystal substrate 20 becomes the second surfaces 2B of the first and second vibration arms 22 and 23. That is, since the second surfaces 2B of the first and second vibration arms 22 and 23 are not etched in the second dry etching step S6, the thickness of the first and second vibration arms 22 and 23 and a surface roughness of the second surface 2B in the second bank portion forming region Qd2 are maintained as the thickness of the quartz crystal substrate 20 and a surface roughness of the second substrate surface 20B. Therefore, thickness accuracy of the first and second vibration arms 22 and 23 is improved, and an unnecessary vibration such as a torsional vibration is prevented from occurring.

In the second dry etching step S6 described above, when the dry etching is ended in a state in which the second protective film 6 does not remain on the second substrate surface 20B of the quartz crystal substrate 20, the second protective film removing step S7 may not be provided.

Although the first protective film 5 remaining on the first substrate surface 20A is removed in the first protective film removing step S4 and the second protective film 6 remaining on the second substrate surface 20B is removed in the second protective film removing step S7 in the present embodiment, the first protective film removing step S4 may not be provided, and the first protective film 5 remaining on the first substrate surface 20A and the second protective film 6 remaining on the second substrate surface 20B may be collectively removed in the second protective film removing step S7.

As shown in FIG. 15, a plurality of vibration substrates 2 are collectively formed from the quartz crystal substrate 20 through the above steps S1 to S7.

Electrode Forming Step S8

A metal film is formed on a surface of the vibration substrate 2 and the metal film is patterned to form the electrode 3.

In this manner, the vibrator element 1 is obtained.

As described above, the present embodiment can obtain the following effects.

The vibrator element 1 includes the first vibration arm 22 and the second vibration arm 23 that extend along the Y direction which is a first direction and that are arranged side by side along the X direction which is a second direction intersecting the Y direction. The first vibration arm 22 and the second vibration arm 23 each have the first surface 2A and the second surface 2B that are arranged side by side in the Z direction which is a third direction intersecting the Y direction and the X direction and that are in a front and back relationship, and respectively have the bottomed first grooves 221 and 231 that open to the first surface 2A and the bottomed second grooves 222 and 232 that open to the second surface 2B. A method for manufacturing the vibrator element 1 includes the preparation step S1 of preparing the quartz crystal substrate 20 having the first substrate surface 20A and the second substrate surface 20B that are in a front and back relationship, the first protective film forming step S2 of forming the first protective film 5 on the first substrate surface 20A, the first dry etching step S3 of dry etching the quartz crystal substrate 20 from the first substrate surface 20A side via the first protective film 5 to form the first surface 2A, the first grooves 221 and 231, and the outer shapes of the first vibration arm 22 and the second vibration arm 23, the second protective film forming step S5 of forming the second protective film 6 on the second substrate surface 20B, and the second dry etching step S6 of dry etching the quartz crystal substrate 20 from the second substrate surface 20B side via the second protective film 6 to form the second surface 2B and the second grooves 222 and 232. The outer shapes of the first vibration arm 22 and the second vibration arm 23 are formed from the first surface 2A to the second surface 2B in the first dry etching step S3, and the outer shapes of the first vibration arm 22 and the second vibration arm 23 are not formed in the second dry etching step S6.

As a result, the outer shapes of the first and second vibration arms 22 and 23 and the first grooves 221 and 231 can be collectively formed, and there is no restriction on the setting of dimensions such as the width of the inter-arm region Q4, the width of the inter-element region Q5, the widths of the first grooves 221 and 231, and the widths of the second grooves 222 and 232, and it is possible to provide a method for manufacturing the vibrator element 1 having a high degree of freedom in design.

The outer shapes of the first vibration arm 22 and the second vibration arm 23 are formed from the first surface 2A to the second surface 2B in the first dry etching step S3, and the outer shapes of the first vibration arm 22 and the second vibration arm 23 are not formed in the second dry etching step S6, so that the step 107 is not formed on the side surfaces 101 and 103 which are the outer surfaces of the first vibration arm 22 and the second vibration arm 23, and it is possible to prevent the occurrence of an unnecessary vibration caused by the step 107 and it is possible to prevent the vibrator element 1 from being broken.

2. Second Embodiment

A method for manufacturing the vibrator element 1 according to a second embodiment will be described with reference to FIG. 16. The same components as those of the first embodiment are denoted by the same reference numerals, and redundant description thereof will be omitted.

The second embodiment is similar to the first embodiment except that T1=0 and T11=0 for the first protective film 5.

Since the preparation step S1 is the same as that of the first embodiment, description thereof will be omitted, and the first protective film forming step S2 will be described.

First Protective Film Forming Step S2

Figure 16:
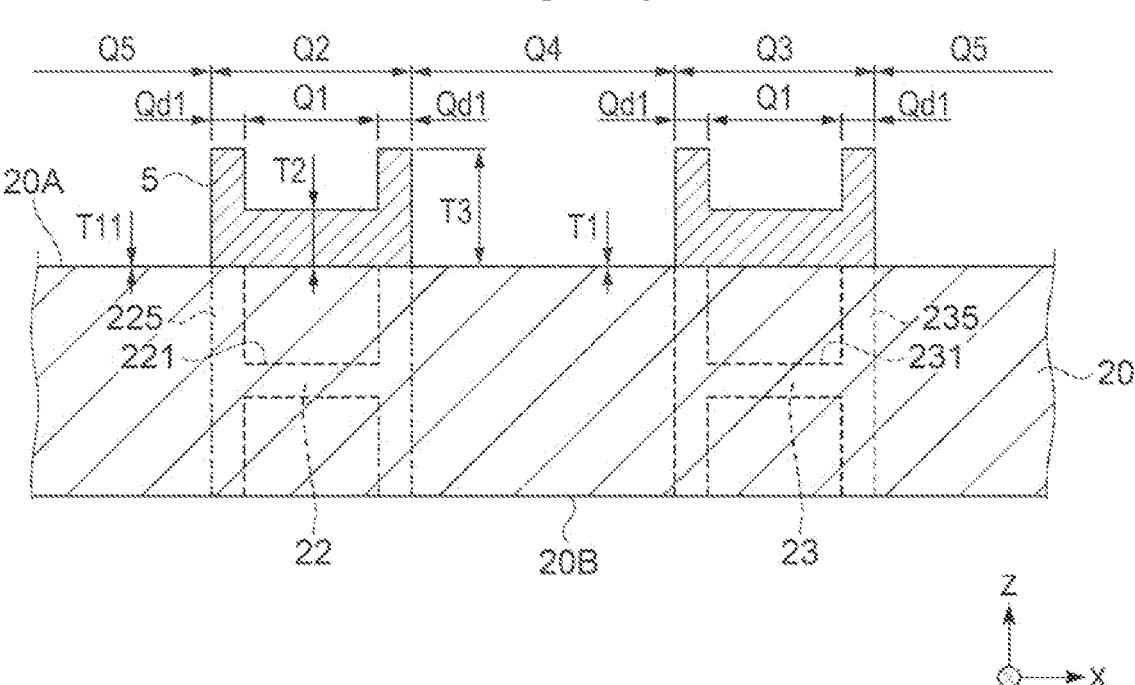
FIG. 16 is a cross sectional view showing a method for manufacturing a vibrator element according to a second embodiment.

As shown in FIG. 16, the first protective film 5 is formed on the first substrate surface 20A of the quartz crystal substrate 20. This step is performed in a similar manner to that in the first embodiment.

The thicknesses of the first protective film 5 satisfy T1<T2<T3 and T11<T2<T3.

In the present embodiment, the first protective film 5 is formed in the first vibration arm forming region Q2 and the second vibration arm forming region Q3 of the first substrate surface 20A, and the first protective film 5 is not formed in the inter-arm region Q4 and the inter-element region Q5 of the first substrate surface 20A. That is, T1=0 and T11=0 for the first protective film 5.

First Dry Etching Step S3

This step is performed in a similar manner to that in the first embodiment.

The outer shapes of the first vibration arm 22 and the second vibration arm 23 are formed from the first substrate surface 20A serving as the first surface 2A of the first vibration arm 22 and the second vibration arm 23 to the second substrate surface 20B serving as the second surface 2B of the first vibration arm 22 and the second vibration arm 23 in the first dry etching step S3.

In the present embodiment, since the first protective film 5 is not formed in the inter-arm region Q4 and the inter-element region Q5 of the first substrate surface 20A in the first protective film forming step S2, the etching of the quartz crystal substrate 20 in the inter-arm region Q4 and the inter-element region Q5 is started together with the start of the dry etching in the first dry etching step S3. Therefore, the first dry etching step S3 can be performed in a short time.

When the first dry etching step S3 is completed, the method proceeds to the first protective film removing step S4.

The first protective film removing step S4 and subsequent steps are the same as those of the first embodiment, and thus description thereof will be omitted.

In this manner, the vibrator element 1 is obtained.

As described above, the present embodiment can obtain the following effects in addition to the effects of the first embodiment.

Since the thickness of the first protective film 5 satisfies T1=0, the inter-arm region Q4 can be etched in a short time.

3. Third Embodiment

A method for manufacturing the vibrator element 1 according to a third embodiment will be described with reference to FIGS. 17 to 32. The same components as those of the first embodiment are denoted by the same reference numerals, and redundant description thereof will be omitted.

The third embodiment is similar to the first embodiment except that a first protective film 5b includes a first under-layer film 51 and a third protective film 53, the first protective film forming step S2 includes a first underlayer film forming step S100 and a third protective film forming step S110, a second protective film 6b includes a second underlayer film 61 and a fourth protective film 63, the second protective film forming step S5 includes a second underlayer film forming step S120 and a fourth protective film forming step S130, and T1=0 and T11=0 for the first protective film 5b.

Since the preparation step S1 is the same as that of the first embodiment, description thereof will be omitted, and the first protective film forming step S2 will be described.

First Protective Film Forming Step S2

Figure 17:
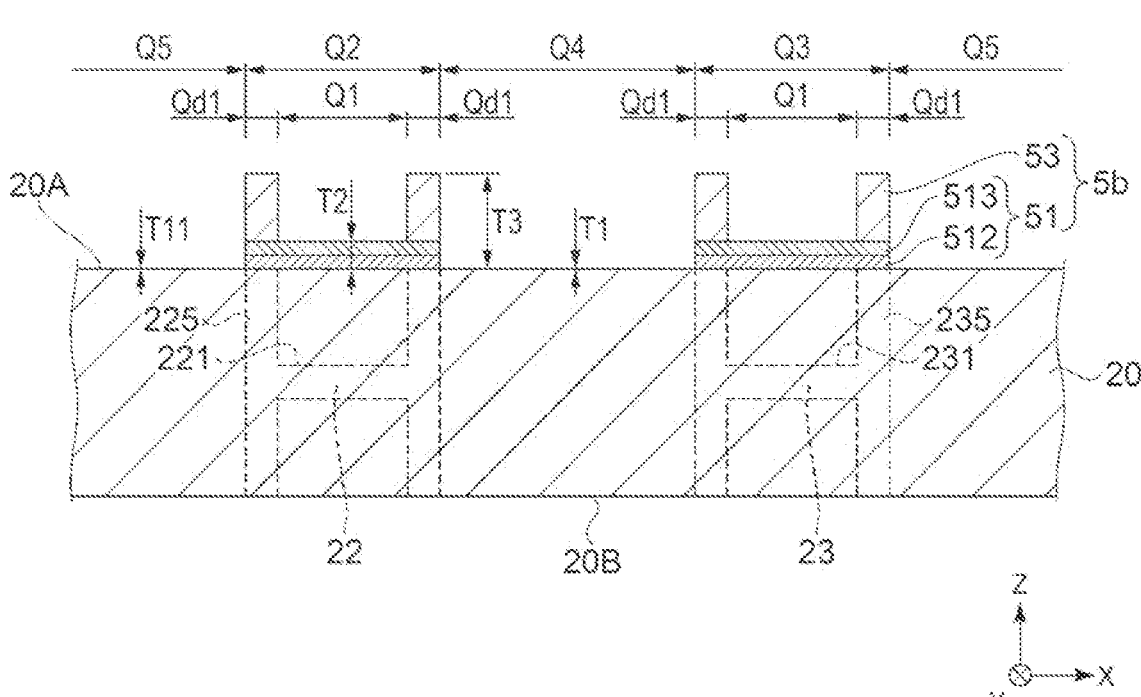
FIG. 17 is a cross sectional view showing a method for manufacturing a vibrator element according to a third embodiment.

As shown in FIG. 17, the first protective film 5b is formed on the first substrate surface 20A of the quartz crystal substrate 20. The first protective film 5b includes the first underlayer film 51 and the third protective film 53.

The first protective film 5b is formed in the first vibration arm forming region Q2 and the second vibration arm form-ing region Q3 of the first substrate surface 20A.

Specifically, the first underlayer film 51 of the first pro-tective film 5b is formed in the first vibration arm forming region Q2 and the second vibration arm forming region Q3 of the first substrate surface 20A. The third protective film 53 of the first protective film 5b is formed in the first bank portion forming region Qd1 on a surface of the first under-layer film 51 at an opposite side from the quartz crystal substrate 20. The surface of the first underlayer film 51 at the opposite side from the quartz crystal substrate 20 is an upper surface of the first underlayer film 51.

That is, the first underlayer film 51 is formed as the first protective film 5b in the first groove forming region Q1 of the first substrate surface 20A. The first underlayer film 51 and the third protective film 53 are formed as the first protective film 5b in the first bank portion forming region Qd1 of the first substrate surface 20A. The first underlayer film 51 and the third protective film 53 are stacked in this order along the positive side of the Z direction in the first bank portion forming region Qd1.

A thickness T2 of the first protective film 5b in the first groove forming region Q1 of the first substrate surface 20A is a thickness of the first underlayer film 51. A thickness T3 of the first protective film 5b in the first bank portion forming region Qd1 of the first substrate surface 20A is a sum of the thickness of the first underlayer film 51 and a thickness of the third protective film 53. Since the first protective film 5b is not formed in the inter-arm region Q4 and the inter-element region Q5, the thicknesses T1 and T11 of the first protective film 5b in the inter-arm region Q4 and the inter-element region Q5 of the first substrate surface 20A satisfy T1=0 and T11=0.

That is, the thicknesses of the first protective film 5b satisfy T1<T2<T3 and T11<T2<T3. Although T1=0 and T11=0 in the present embodiment, the thicknesses of the first protective film 5b may be 0<T1 and 0<T11 as long as T1<T2<T3 and T11<T2<T3.

The first underlayer film 51 will be described.

The first underlayer film 51 is made of a material that is etched at a predetermined etching rate in the first dry etching step S3.

In the present embodiment, the first underlayer film 51 is a metal film made of a metal. The first underlayer film 51 is formed by stacking a first metal film 512 and a second metal film 513. The first metal film 512 is formed on the first substrate surface 20A of the quartz crystal substrate 20. The second metal film 513 is formed on a surface of the first metal film 512 at an opposite side from the quartz crystal substrate 20. The surface of the first metal film 512 at the opposite side from the quartz crystal substrate 20 is an upper surface of the first metal film 512. The first metal film 512 is made of chromium (Cr). The second metal film 513 is made of copper (Cu).

Although the first underlayer film 51 is formed by stack-ing the first metal film 512 and the second metal film 513 in the present embodiment, the disclosure is not limited thereto, and the first underlayer film 51 may be formed of one film, or may be formed by stacking three or more films.

The first underlayer film 51 may be made of a material other than metal. For example, the first underlayer film 51 may be a resist film made of a resist material. In a case where the first underlayer film 51 is a metal film, the thickness of the first underlayer film 51 can be made smaller than that in a case where the first underlayer film 51 is a resist film. Accordingly, dimensional accuracy of the first and second vibration arms 22 and 23, the first grooves 221 and 231, and the like formed in the first dry etching step S3 can be improved.

Next, the third protective film 53 will be described.

The third protective film 53 is made of a material that is etched at a predetermined etching rate in the first dry etching step S3.

In the present embodiment, the third protective film 53 is a metal film made of a metal. For example, nickel (Ni) can be used as the metal for forming the third protective film 53. The third protective film 53 may be made of a material other than metal. For example, the third protective film 53 may be a resist film made of a resist material. In a case where the third protective film 53 is a metal film, the thickness of the third protective film 53 can be made smaller than that in a case where the third protective film 53 is a resist film. Accordingly, dimensional accuracy of the first and second vibration arms 22 and 23, the first grooves 221 and 231, and the like formed in the first dry etching step S3 can be further improved.

Next, a method for forming the first protective film 5b will be described.

Figure 18:
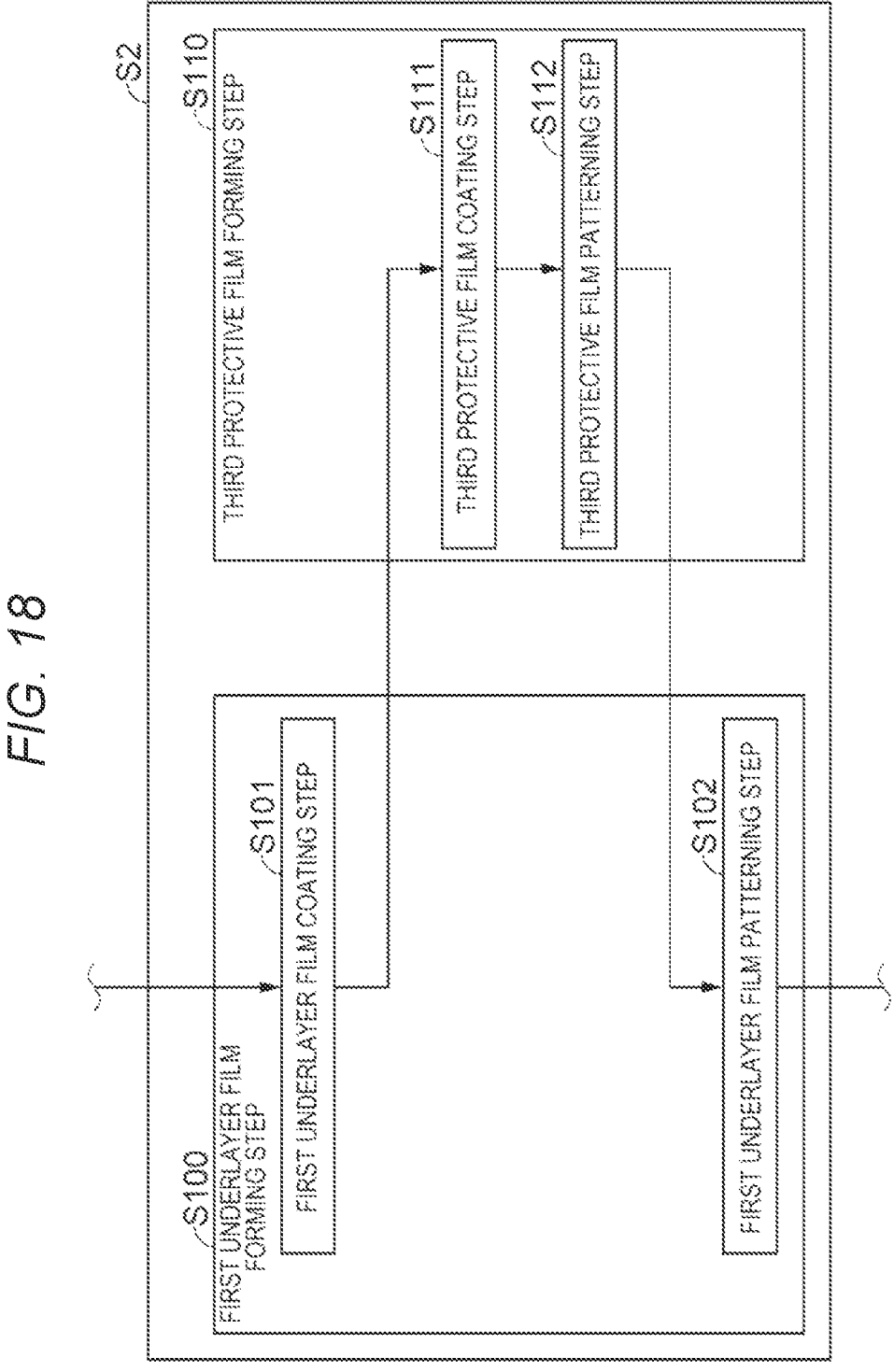
FIG. 18 is a diagram showing a first protective film forming step.

As shown in FIG. 18, the first protective film forming step S2 includes the first underlayer film forming step S100 and the third protective film forming step S110 in the present embodiment.

The first underlayer film forming step S100 is a step of forming the first underlayer film 51 on the first substrate surface 20A of the quartz crystal substrate 20 in the first vibration arm forming region Q2 in which the first vibration arm 22 is formed and the second vibration arm forming region Q3 in which the second vibration arm 23 is formed.

The first underlayer film forming step S100 includes a first underlayer film coating step S101 of coating the first substrate surface 20A of the quartz crystal substrate 20 with the first underlayer film 51, and a first underlayer film patterning step S102 of patterning the first underlayer film 51.

The first underlayer film 51 is also referred to as the underlayer film 51, and the first underlayer film forming step S100 is also referred to as the underlayer film forming step S100.

The third protective film forming step S110 is a step of forming, on the first underlayer film 51 formed in the first underlayer film forming step S100, the third protective film 53 in the first bank portion forming region Qd1 which is a region excluding the first groove forming region Q1 in which the first grooves 221 and 231 are formed.

The third protective film forming step S110 includes a third protective film coating step S111 of coating the first underlayer film 51 with the third protective film 53, and a third protective film patterning step S112 of patterning the third protective film 53.

Although the first underlayer film coating step S101, the third protective film coating step S111, the third protective film patterning step S112, and the first underlayer film patterning step S102 are performed in this order in the present embodiment, the order of the steps S101, S102, S111, and S112 is not limited thereto. For example, the method may be performed in order of the step S101, the step S102, the step S111, and the step S112, or may be performed in order of the step S101, the step S111, the step S102, and the step S112.

First Underlayer Film Coating Step S101

Figure 19:
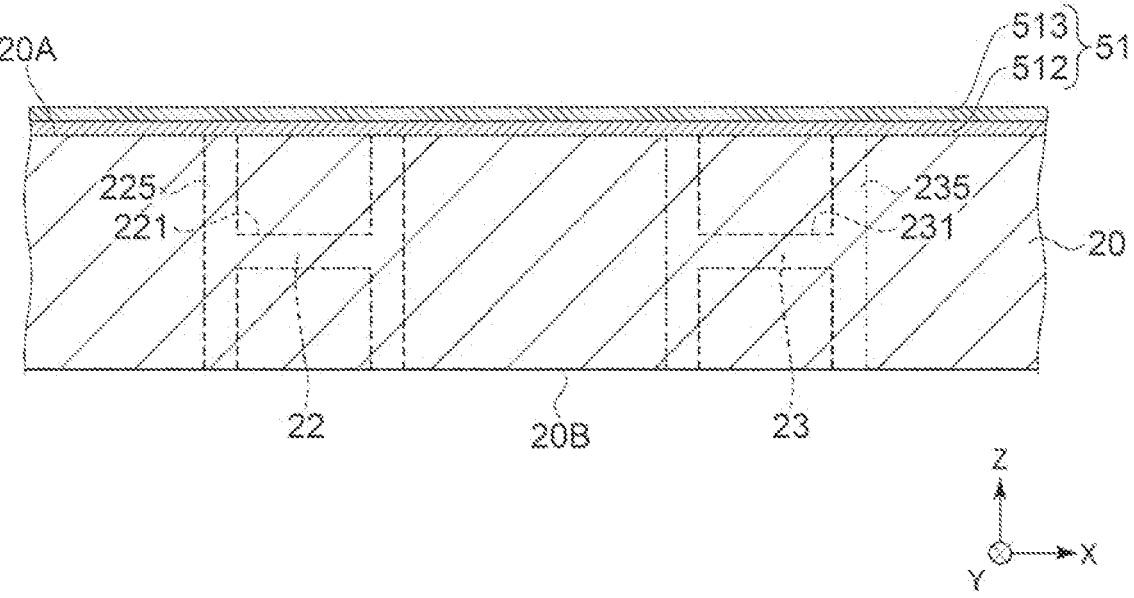
FIG. 19 is a cross sectional view showing a method for forming a first protective film.

As shown in FIG. 19, the first substrate surface 20A of the quartz crystal substrate 20 is covered with the first underlayer film 51.

Third Protective Film Coating Step S111

Figure 20:
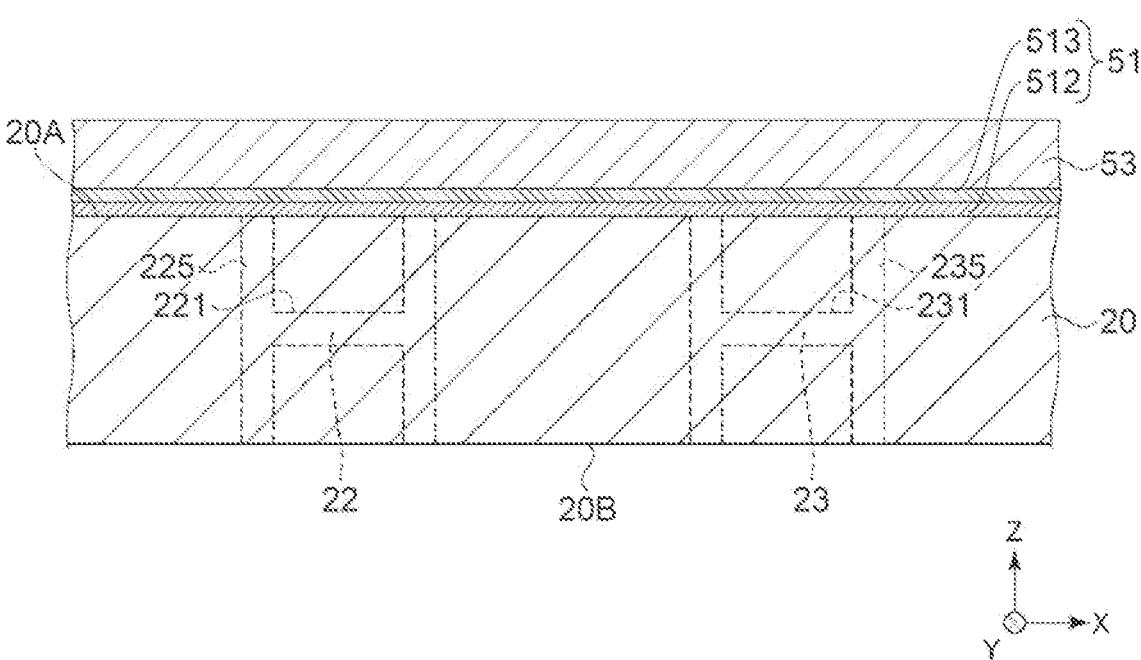
FIG. 20 is a cross sectional view showing the method for forming the first protective film.

As shown in FIG. 20, the first underlayer film 51 is covered with the third protective film 53. The third protective film 53 is formed on the surface of the first underlayer film 51 at an opposite side from the quartz crystal substrate 20.

Third Protective Film Patterning Step S112

Figure 21:
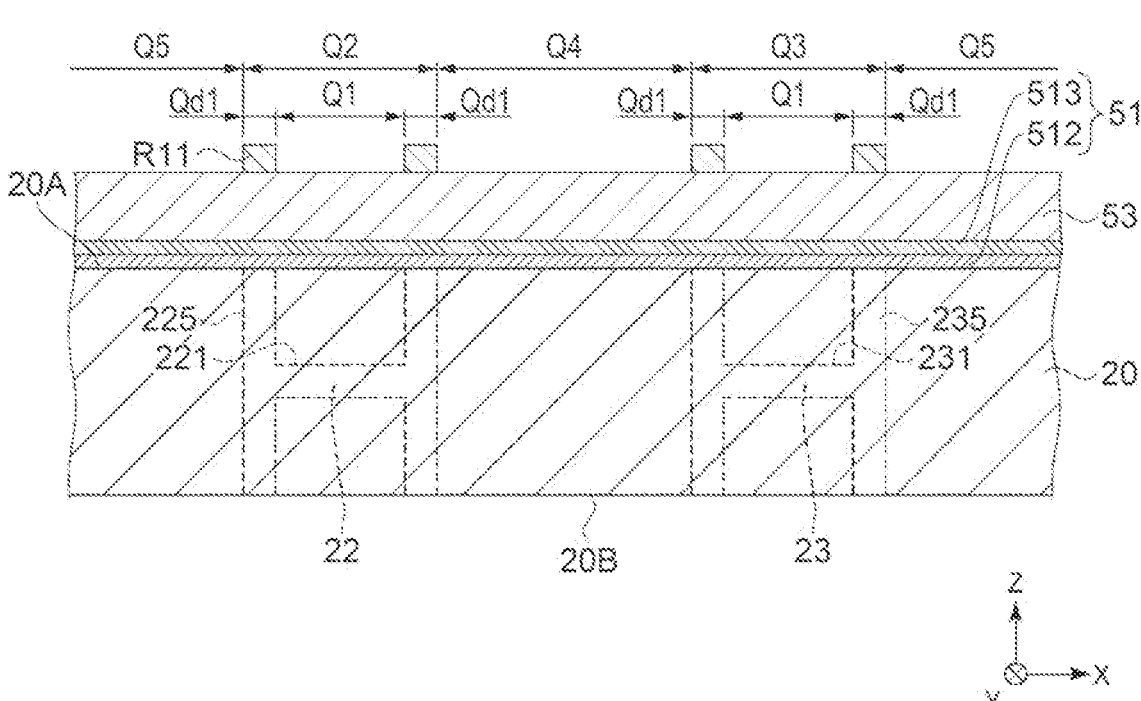
FIG. 21 is a cross sectional view showing the method for forming the first protective film.

First, as shown in FIG. 21, a second resist film R11 is formed on a surface of the third protective film 53 at an opposite side from the quartz crystal substrate 20. The surface of the third protective film 53 at the opposite side from the quartz crystal substrate 20 is an upper surface of the third protective film 53. The second resist film R11 is formed in the first bank portion forming region Qd1 using a photolithography technique. That is, the second resist film R11 overlaps the first bank portion forming region Qd1 in a plan view.

Next, the third protective film 53 is etched from a surface side of the third protective film 53 where the second resist film R11 is formed. That is, the third protective film 53 is etched from the upper surface side of the third protective film 53 using the second resist film R11 as a mask. As a result, the third protective film 53 in the first groove forming region Q1, the inter-arm region Q4, and the inter-element region Q5 in which the second resist film R11 is not formed is removed.

Figure 22:
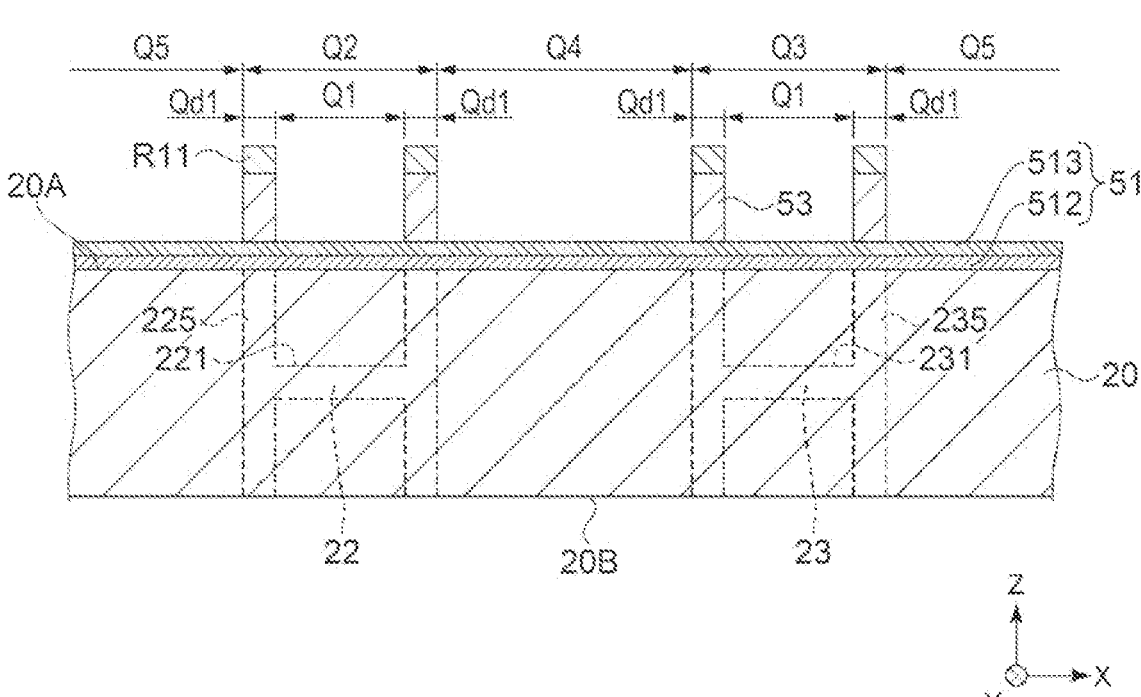
FIG. 22 is a cross sectional view showing the method for forming the first protective film.

In this manner, the third protective film 53 can be formed in the first bank portion forming region Qd1 in a region in which the first underlayer film 51 is formed, as shown in FIG. 22.

Figure 23:
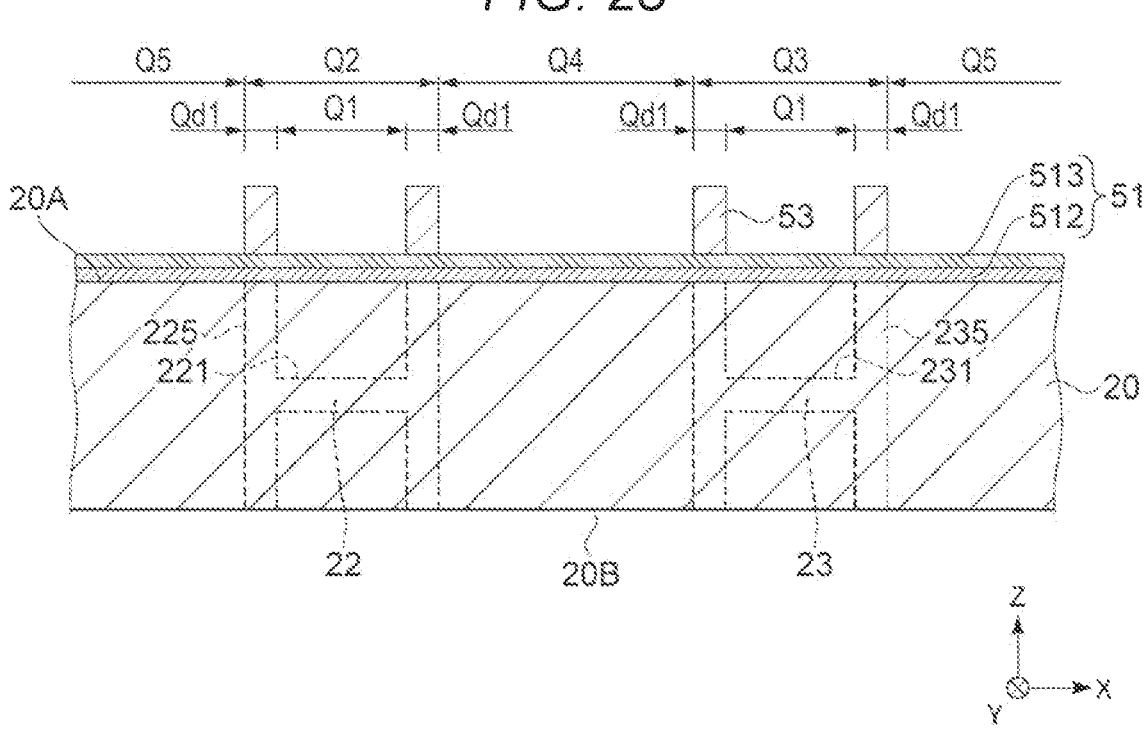
FIG. 23 is a cross sectional view showing the method for forming the first protective film.

Next, as shown in FIG. 23, the second resist film R11 is removed, and the method proceeds to the first underlayer film patterning step S102.

First Underlayer Film Patterning Step S102

Figure 24:
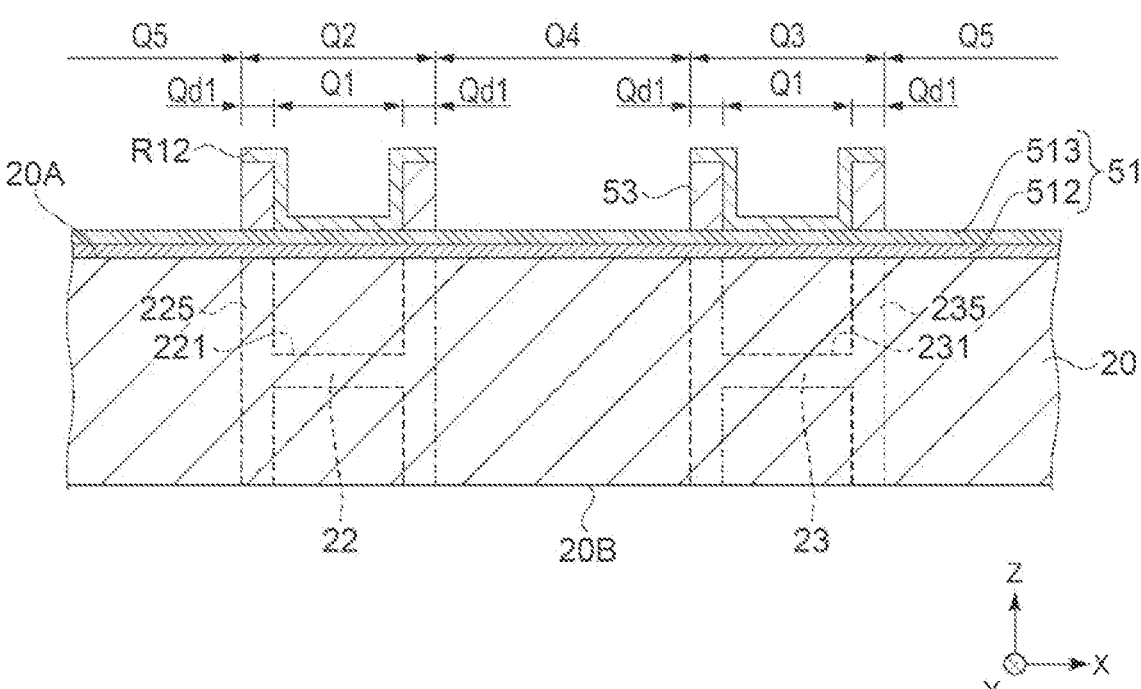
FIG. 24 is a cross sectional view showing the method for forming the first protective film.

First, as shown in FIG. 24, a third resist film R12 is formed using a photolithography technique in the first vibration arm forming region Q2 and the second vibration arm forming region Q3 in the region in which the first underlayer film 51 is formed.

In the present embodiment, prior to the first underlayer film patterning step S102, the third protective film 53 is formed in the first bank portion forming region Qd1. Therefore, the third resist film R12 is formed in a manner of covering the first underlayer film 51 with the third protective film 53 in the first bank portion forming region Qd1 in the region in which the first underlayer film 51 is formed interposed therebetween. The third resist film R12 is formed in a manner of covering the upper surface of the first underlayer film 51 without the third protective film 53 being interposed between the third resist film R12 and the first underlayer film 51 in the first groove forming region Q1 in the region in which the first underlayer film 51 is formed.

Next, the first underlayer film 51 is etched via the third resist film R12 from a surface side of the first underlayer film 51 where the third resist film R12 is formed. That is, the first underlayer film 51 is etched from the upper surface side of the first underlayer film 51 using the third resist film R12 as a mask.

The third resist film R12 is formed in the first vibration arm forming region Q2 and the second vibration arm forming region Q3, and is not formed in the inter-arm region Q4 and the inter-element region Q5. Therefore, the first underlayer film 51 in the inter-arm region Q4 and the inter-element region Q5 is removed in the first underlayer film patterning step S102.

Figures 25, 26:
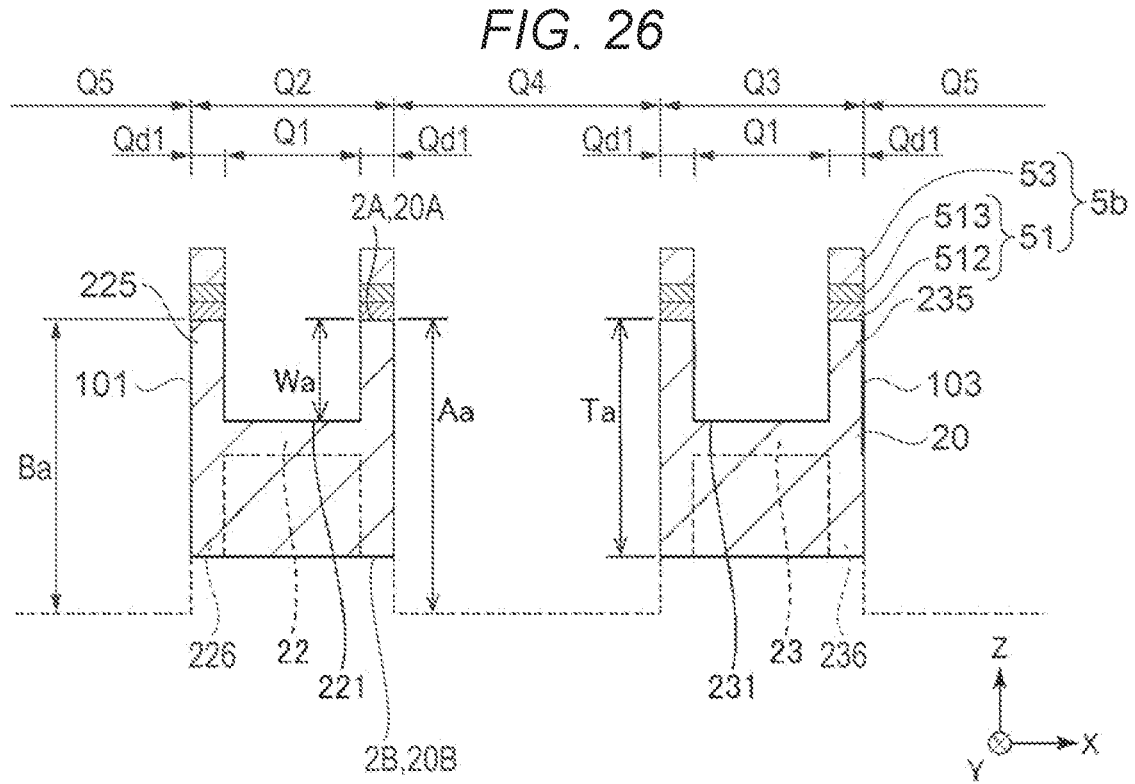
FIG. 25 is a cross sectional view showing the method for forming the first protective film.
FIG. 26 is a cross sectional view showing the method for manufacturing the vibrator element.

In this manner, as shown in FIG. 25, the first underlayer film 51 is formed in the first vibration arm forming region Q2 and the second vibration arm forming region Q3 of the first substrate surface 20A.

Next, the third resist film R12 is removed. In this manner, the first protective film 5b shown in FIG. 17 is formed.

When the removal of the third resist film R12 is completed, the method proceeds to the first dry etching step S3.

First Dry Etching Step S3

This step is performed in a similar manner to that in the first embodiment.

As shown in FIG. 26, the quartz crystal substrate 20 is dry etched from the first substrate surface 20A side via the first protective film 5, and the first surface 2A, the first grooves 221 and 231, and the outer shapes of the first vibration arm 22 and the second vibration arm 23 are simultaneously formed.

In the first dry etching step S3, the first underlayer film 51 and the third protective film 53 formed on the first substrate surface 20A of the quartz crystal substrate 20 are etched at respective predetermined etching rates. Therefore, respective etching depths of the quartz crystal substrate 20 in a region in which the first substrate surface 20A is exposed without forming the first protective film 5b, the region in which the first underlayer film 51 is formed as the first protective film 5b, and a region in which the first underlayer film 51 and the third protective film 53 are formed as the first protective film 5b can be controlled by the first underlayer film 51 and the third protective film 53.

That is, the first protective film 5b including the first underlayer film 51 and the third protective film 53 is formed in the first protective film forming step S2, so that the outer shapes of the first and second vibration arms 22 and 23 and the first grooves 221 and 231 can be collectively formed without using a micro loading effect in the first dry etching step S3.

The first protective film 5b including the first underlayer film 51 and the third protective film 53 is formed in the first protective film forming step S2, so that the outer shapes of the first vibration arm 22 and the second vibration arm 23 can be formed from the first substrate surface 20A serving as the first surface 2A of the first vibration arm 22 and the second vibration arm 23 to the second substrate surface 20B serving as the second surface 2B of the first vibration arm 22 and the second vibration arm 23 in the first dry etching step S3.

As described above, in the present embodiment, the first protective film 5b is not formed in the inter-arm region Q4 and the inter-element region Q5 of the first substrate surface 20A in the first protective film forming step S2. In other words, the first underlayer film 51 is not formed in the inter-arm region Q4 and the inter-element region Q5 of the first substrate surface 20A. That is, T1=0 and T11=0 for the first protective film 5b.

As described above, since the first protective film 5b is not formed in the inter-arm region Q4 and the inter-element region Q5 of the first substrate surface 20A, the etching of the quartz crystal substrate 20 in the inter-arm region Q4 and the inter-element region Q5 is started together with the start of the dry etching in the first dry etching step S3. Therefore, the first dry etching step S3 can be performed in a short time.

The first dry etching step S3 is ended in a state in which the first protective film 5b remains in the first bank portion forming region Qd1 of the first substrate surface 20A in the present embodiment. Therefore, the first bank portion forming region Qd1 of the first substrate surface 20A becomes the first surface 2A of the first and second vibration arms 22 and 23. The first dry etching step S3 may be ended in a state in which the first protective film 5b does not remain in the first bank portion forming region Qd1 of the first substrate surface 20A.

When the first dry etching step S3 is completed, the method proceeds to the first protective film removing step S4.

Since the first protective film removing step S4 is the same as that of the first embodiment, description thereof will be omitted, and the second protective film forming step S5 will be described. After the completion of the first protective film removing step S4, the method proceeds to a processing of the second substrate surface 20B of the quartz crystal substrate 20.

Second Protective Film Forming Step S5

Figure 27:
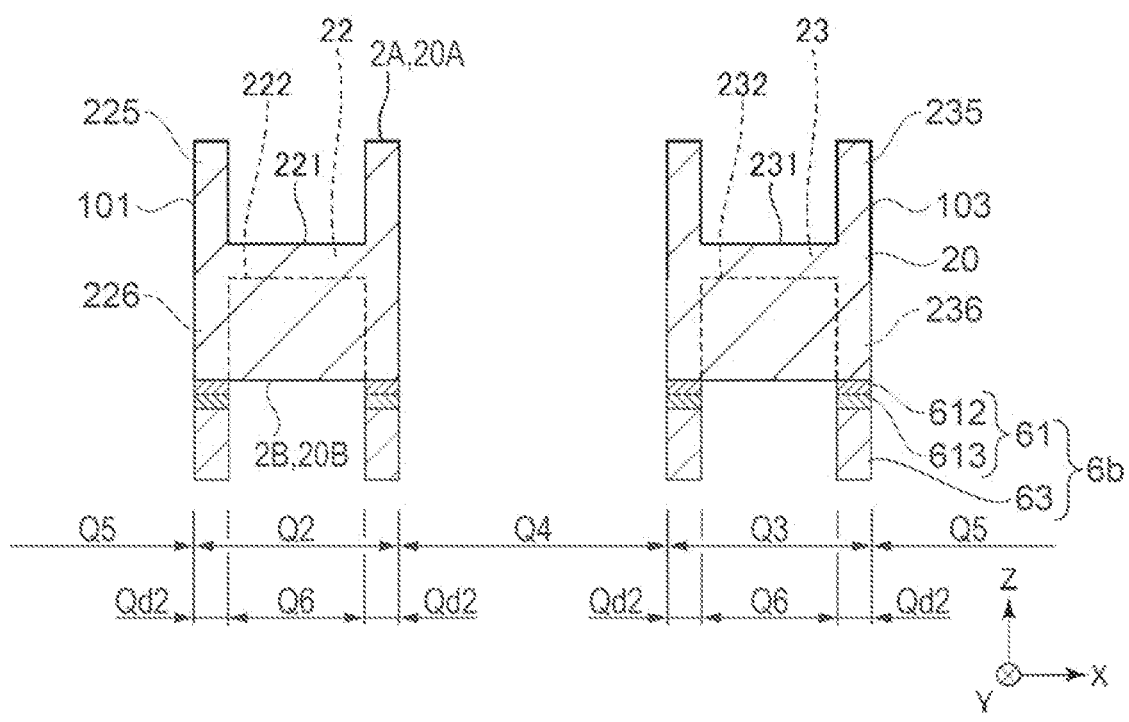
FIG. 27 is a cross sectional view showing the method for manufacturing the vibrator element.

As shown in FIG. 27, the second protective film 6b is formed on the second substrate surface 20B of the quartz crystal substrate 20. The second protective film 6b includes the second underlayer film 61 and the fourth protective film 63.

The second protective film 6b is formed on the second substrate surface 20B in a region other than the second groove forming region Q6. In the present embodiment, the second protective film 6b is formed in the second bank portion forming region Qd2 of the second substrate surface 20B.

Specifically, the second underlayer film 61 of the second protective film 6b is formed in the second bank portion forming region Qd2 of the second substrate surface 20B. The fourth protective film 63 of the second protective film 6b is formed in the second bank portion forming region Qd2 on a surface of the second underlayer film 61 at an opposite side from the quartz crystal substrate 20. The surface of the second underlayer film 61 at the opposite side from the quartz crystal substrate 20 is a lower surface of the second underlayer film 61.

That is, the second underlayer film 61 and the fourth protective film 63 are stacked in this order along the negative side of the Z direction in the second bank portion forming region Qd2 of the second substrate surface 20B.

The second underlayer film 61 will be described.

The second underlayer film 61 is made of a material that is etched at a predetermined etching rate in the second dry etching step S6.

In the present embodiment, the second underlayer film 61 is a metal film made of a metal. The second underlayer film 61 is formed by stacking a first metal film 612 and a second metal film 613.

Although the second underlayer film 61 is formed by stacking the first metal film 612 and the second metal film 613 in the present embodiment, the disclosure is not limited thereto, and the second underlayer film 61 may be formed of one film, or may be formed by stacking three or more films.

The second underlayer film 61 may be formed of a material other than metal. For example, the second underlayer film 61 may be a resist film made of a resist material.

Next, the fourth protective film 63 will be described.

The fourth protective film 63 is made of a material that is etched at a predetermined etching rate in the second dry etching step S6.

In the present embodiment, the fourth protective film 63 is a metal film made of a metal. For example, nickel (Ni) can be used as the metal for forming the fourth protective film 63. The fourth protective film 63 may be made of a material other than metal. For example, the fourth protective film 63 may be a resist film made of a resist material.

Next, a method for forming the second protective film 6b will be described.

Figure 28:
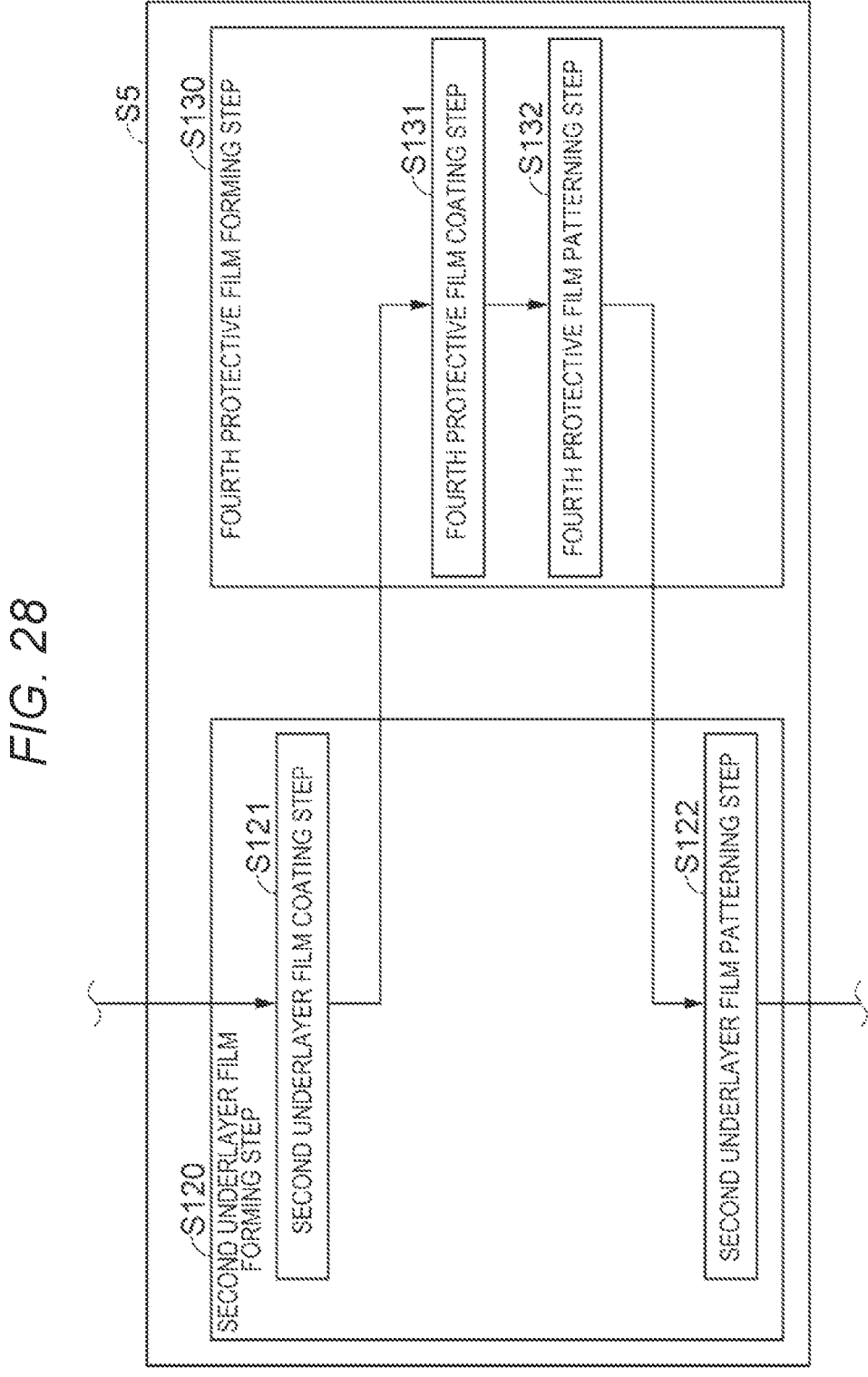
FIG. 28 is a diagram showing a second protective film forming step.

As shown in FIG. 28, the second protective film forming step S5 includes the second underlayer film forming step S120 and the fourth protective film forming step S130 in the present embodiment.

The second underlayer film forming step S120 is a step of forming the second underlayer film 61 in the second bank portion forming region Qd2 on the second substrate surface 20B of the quartz crystal substrate 20.

The second underlayer film forming step S120 includes a second underlayer film coating step S121 of coating the second substrate surface 20B of the quartz crystal substrate 20 with the second underlayer film 61, and a second underlayer film patterning step S122 of patterning the second underlayer film 61.

The fourth protective film forming step S130 is a step of forming the fourth protective film 63 in the second bank portion forming region Qd2 on the second underlayer film 61 formed in the second underlayer film forming step S120.

The fourth protective film forming step S130 includes a fourth protective film coating step S131 of coating the second underlayer film 61 with the fourth protective film 63, and a fourth protective film patterning step S132 of patterning the fourth protective film 63.

Although the second underlayer film coating step S121, the fourth protective film coating step S131, the fourth protective film patterning step S132, and the second underlayer film patterning step S122 are performed in this order in the present embodiment, the order of the steps S121, S122, S131, and S132 is not limited thereto. For example, the method may be performed in order of the step S121, the step S122, the step S131, and the step S132.

Second Underlayer Film Coating Step S121

Figures 29, 30:
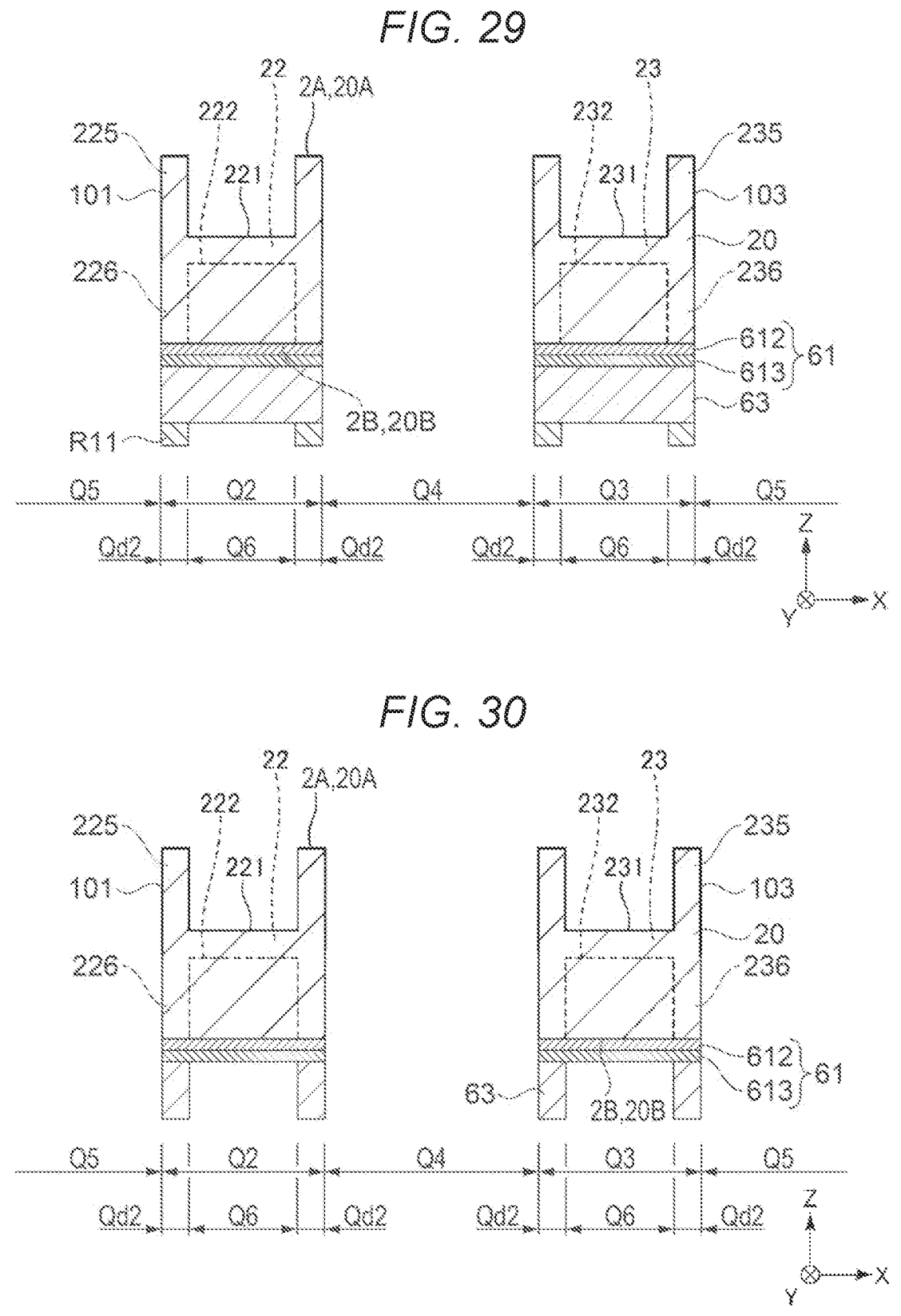

As shown in FIG. 29, the second substrate surface 20B of the quartz crystal substrate 20 is covered with the second underlayer film 61.

Fourth Protective Film Coating Step S131

As shown in FIG. 29, the second underlayer film 61 is covered with the fourth protective film 63. The fourth protective film 63 is formed on a surface of the second underlayer film 61 at an opposite side from the quartz crystal substrate 20.

Fourth Protective Film Patterning Step S132

First, as shown in FIG. 29, the second resist film R11 is formed on a surface of the fourth protective film 63 at an opposite side from the quartz crystal substrate 20. The surface of the fourth protective film 63 at the opposite side from the quartz crystal substrate 20 is a lower surface of the fourth protective film 63. The second resist film R11 is formed in a region other than the second groove forming region Q6 using a photolithography technique. In the present embodiment, the second resist film R11 is formed in the second bank portion forming region Qd2. That is, the second resist film R11 overlaps the second bank portion forming region Qd2 in a plan view.

Next, the fourth protective film 63 is etched from a surface side of the fourth protective film 63 where the second resist film R11 is formed. That is, the fourth protective film 63 is etched from a lower surface side of the fourth protective film 63 using the second resist film R11 as a mask. As a result, as shown in FIG. 30, the fourth protective film 63 in the second groove forming region Q6 in which second resist film R11 is not formed is removed.

Next, as shown in FIG. 30, the second resist film R11 is removed, and the method proceeds to the second underlayer film patterning step S122.

Second Underlayer Film Patterning Step S122

Figure 31:
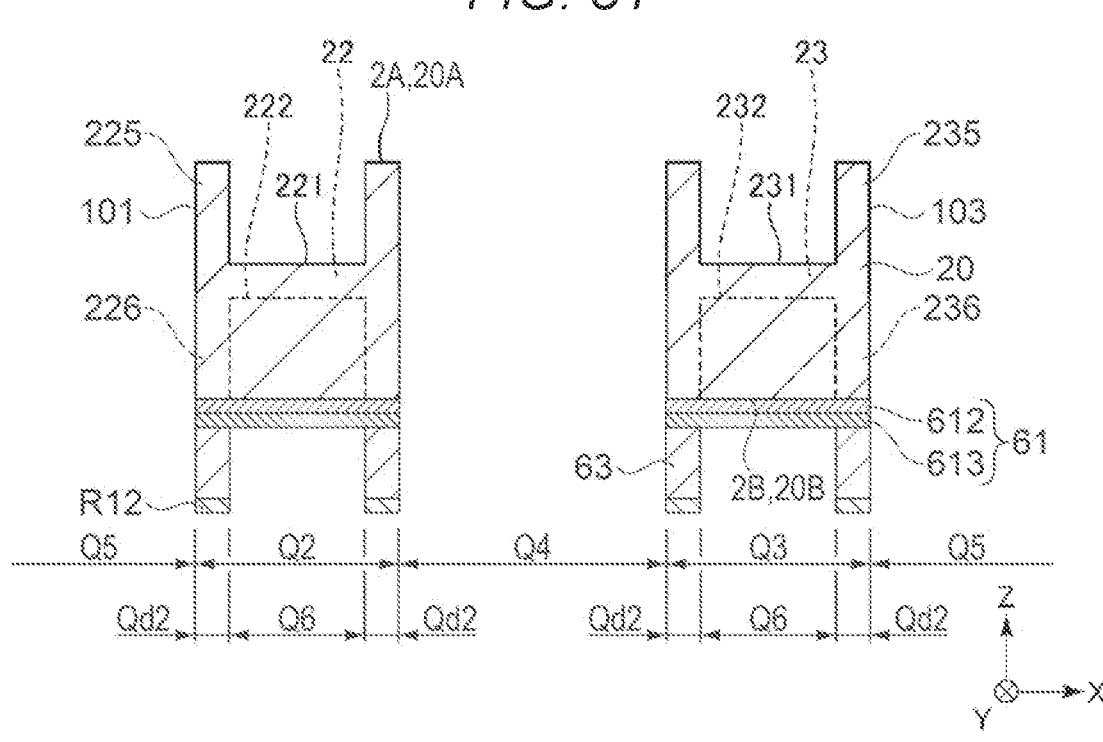
FIG. 31 is a cross sectional view showing the method for forming the second protective film.

First, as shown in FIG. 31, the third resist film R12 is formed on the second underlayer film 61 in a region other than the second groove forming region Q6 using a photolithography technique. The third resist film R12 is formed in the second bank portion forming region Qd2 in the present embodiment.

In the present embodiment, prior to the second underlayer film patterning step S122, the fourth protective film 63 is formed in the second bank portion forming region Qd2. Therefore, the third resist film R12 is formed in a manner of covering the second underlayer film 61 with the fourth protective film 63 in the second bank portion forming region Qd2 interposed therebetween.

Next, the second underlayer film 61 is etched via the third resist film R12 from a surface side of the second underlayer film 61 where the third resist film R12 is formed. That is, the second underlayer film 61 is etched from a lower surface side of the second underlayer film 61 using the third resist film R12 as a mask.

The third resist film R12 is formed in the second bank portion forming region Qd2, and is not formed in the second groove forming region Q6. Therefore, the second underlayer film 61 in the second groove forming region Q6 is removed in the second underlayer film patterning step S122.

In this manner, the second underlayer film 61 is formed in the second bank portion forming region Qd2 of the second substrate surface 20B.

Next, the third resist film R12 is removed. In this manner, the second protective film 6*b* shown in FIG. 27 is formed.

When the removal of the third resist film R12 is completed, the method proceeds to the second dry etching step S6.

Second Dry Etching Step S6

This step is performed in a similar manner to that in the first embodiment.

Figure 32:
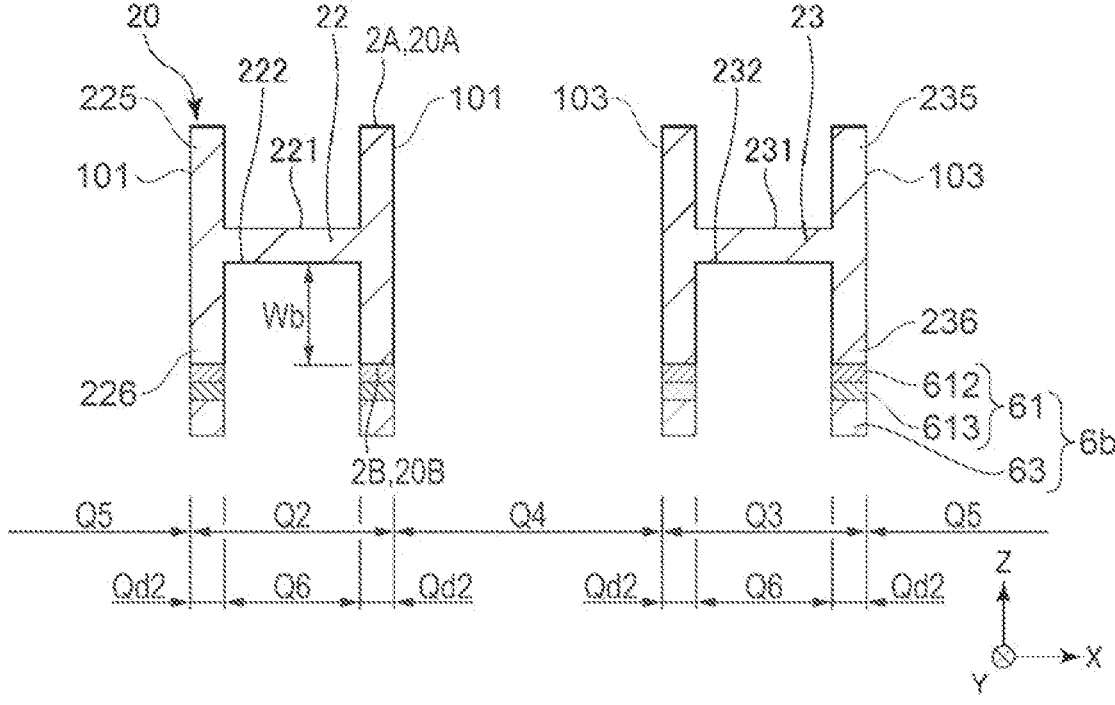
FIG. 32 is a cross sectional view showing the method for manufacturing the vibrator element.

As shown in FIG. 32, the quartz crystal substrate 20 is dry etched from the second substrate surface 20B side via the second protective film 6*b*, and the second surface 2B and the second grooves 222 and 232 are simultaneously formed.

As described above, the second protective film 6*b* is not formed in the second groove forming region Q6 of the second substrate surface 20B in the second protective film forming step S5. Therefore, the second groove forming region Q6 of the quartz crystal substrate 20 is etched in the second dry etching step S6.

The outer shapes of the first vibration arm 22 and the second vibration arm 23 are formed from the first surface 2A of the first vibration arm 22 and the second vibration arm 23 to the second surface 2B of the first vibration arm 22 and the second vibration arm 23 in the first dry etching step S3. Therefore, the outer shapes of the first vibration arm 22 and the second vibration arm 23 are not formed in the second dry etching step S6.

The second dry etching step S6 is ended in a state in which the second protective film 6*b* remains in the second bank portion forming region Qd2 of the second substrate surface 20B in the present embodiment. Therefore, the second bank portion forming region Qd2 of the second substrate surface 20B becomes the second surface 2B of the first and second vibration arms 22 and 23. The second dry etching step S6 may be ended in a state in which the second protective film 6*b* does not remain in the second bank portion forming region Qd2 of the second substrate surface 20B.

When the second dry etching step S6 is ended, the method proceeds to the second protective film removing step S7.

The second protective film removing step S7 and subsequent steps are the same as those of the first embodiment, and thus description thereof will be omitted.

In this manner, the vibrator element 1 is obtained.

Although the second underlayer film 61 is formed in the second bank portion forming region Qd2 of the second substrate surface 20B, and is not formed in the second groove forming region Q6 in the second underlayer film forming step S120 in the present embodiment, the second underlayer film 61 may be formed in the second groove forming region Q6. That is, as shown in FIG. 30, the second underlayer film 61 may be formed in the second bank portion forming region Qd2 and the second groove forming region Q6 of the second substrate surface 20B.

In such a case, the second grooves 222 and 232 can be formed by performing dry etching in the second dry etching step S6. Since it is not necessary to remove the second underlayer film 61 from the second groove forming region Q6, the second underlayer film patterning step S122 can be omitted, and the second protective film forming step S5 can be simplified.

As described above, the present embodiment can obtain the following effects.

By forming the first protective film 5*b* including the first underlayer film 51 and the third protective film 53, the same effects as those of the first embodiment can be obtained.

Since the first underlayer film 51 is not formed in the inter-arm region Q4, that is, T1=0, the same effects as those of the second embodiment can be obtained.

A method for manufacturing the vibrator element 1 has been described above based on the first embodiment, the second embodiment, and the third embodiment. The present disclosure is not limited thereto, and a configuration of each part can be replaced with a configuration having the same function. In addition, any other constituents may be added to the present disclosure. The embodiments may be combined as appropriate.

For example, although the first dry etching step S3 that is a step of forming the outer shapes of the first vibration arm 22 and the second vibration arm 23 from the first surface 2A to the second surface 2B is performed, and then the second dry etching step S6 that is a step in which the outer shapes of the first vibration arm 22 and the second vibration arm 23 are not formed is performed in the present disclosure, the order of the first dry etching step S3 and the second dry etching step S6 is not limited thereto. That is, the second dry etching step S6 that is a step in which the outer shapes of the first vibration arm 22 and the second vibration arm 23 are not formed may be performed, and then the first dry etching step S3 of forming the outer shapes of the first vibration arm 22 and the second vibration arm 23 from the first surface 2A to the second surface 2B may be performed.

Specifically, for example, the method for manufacturing the vibrator element 1 may be performed in order of the preparation step S1, the second protective film forming step S5, the second dry etching step S6, the second protective film removing step S7, the first protective film forming step S2, the first dry etching step S3, the first protective film removing step S4, and the electrode forming step S8. In this case, the second protective films 6 and 6b are formed in the second bank portion forming region Qd2, the inter-arm region Q4, and the inter-element region Q5 which are regions other than the second groove forming region Q6 of the second substrate surface 20B in the second protective film forming step S5. The second groove forming region Q6 is etched to form the second grooves 222 and 232 in the second dry etching step S6. The second protective films 6 and 6b are formed in a region other than the second groove forming region Q6 of the second substrate surface 20B in the second protective film forming step S5, so that the outer shapes of the first vibration arm 22 and the second vibration arm 23 are not formed in the second dry etching step S6.

The vibrator element manufactured using the method for manufacturing a vibrator element according to the present disclosure is not particularly limited.

Figure 33:
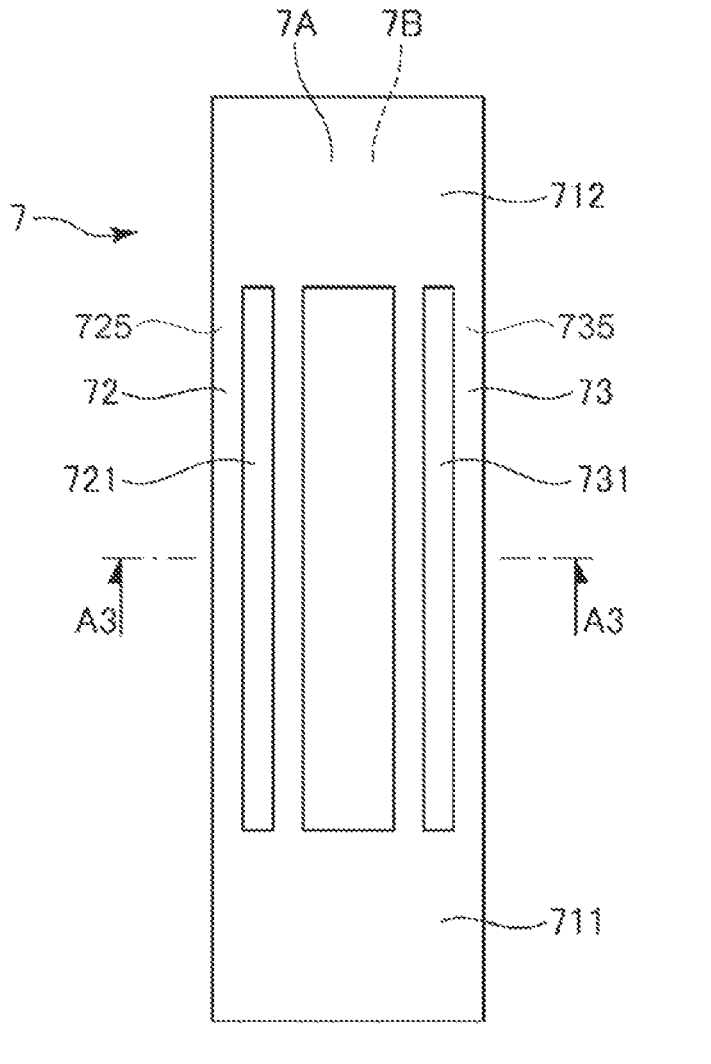
FIG. 33 is a plan view showing a vibrator element according to a modification.
Figure 33:
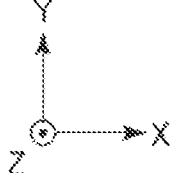
Figure 34:
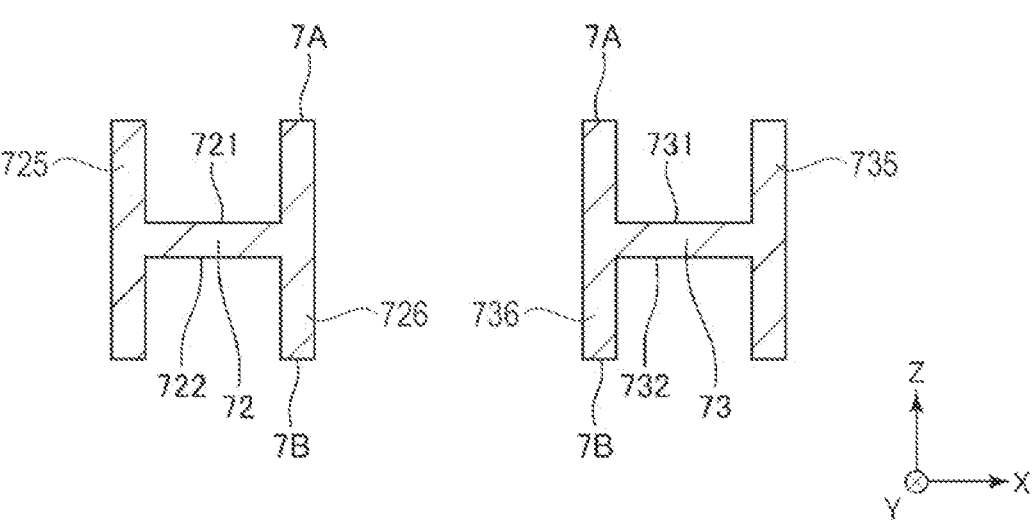
FIG. 34 is a cross sectional view taken along a line A3-A3 in FIG. 33.

The vibrator element manufactured using the method for manufacturing a vibrator element according to the present disclosure may be, for example, a double tuning fork type vibrator element 7 as shown in FIGS. 33 and 34. In FIGS. 33 and 34, electrodes are not shown. The double tuning fork type vibrator element 7 includes a pair of base portions 711 and 712, and a first vibration arm 72 and a second vibration arm 73 that couple the base portions 711 and 712. In addition, the first vibration arm 72 and the second vibration arm 73 respectively include bottomed first grooves 721 and 731 that open to a first surface 7A, bottomed second grooves 722 and 732 that open to a second surface 7B, first bank portions 725 and 735 that respectively define the first grooves 721 and 731, and second bank portions 726 and 736 that respectively define the second grooves 722 and 732.

Figure 35:
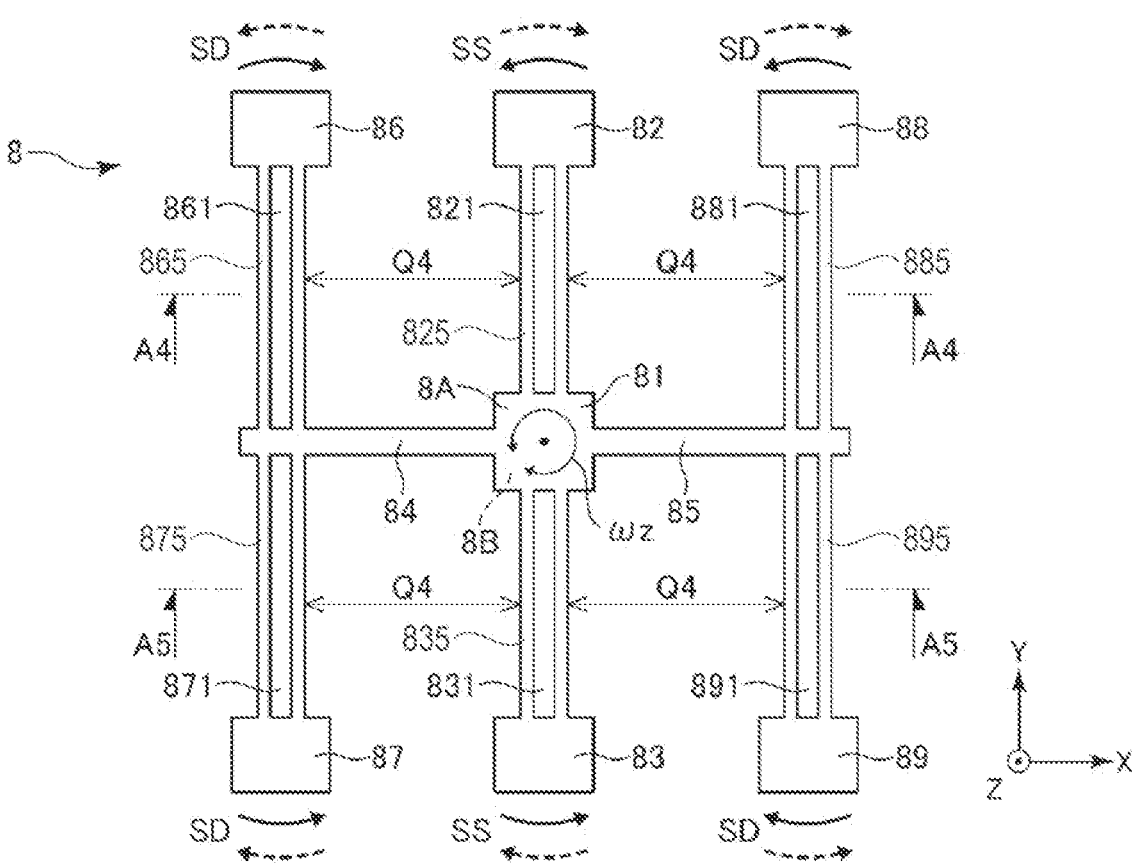
FIG. 35 is a plan view showing a vibrator element according to a modification.
Figure 36:
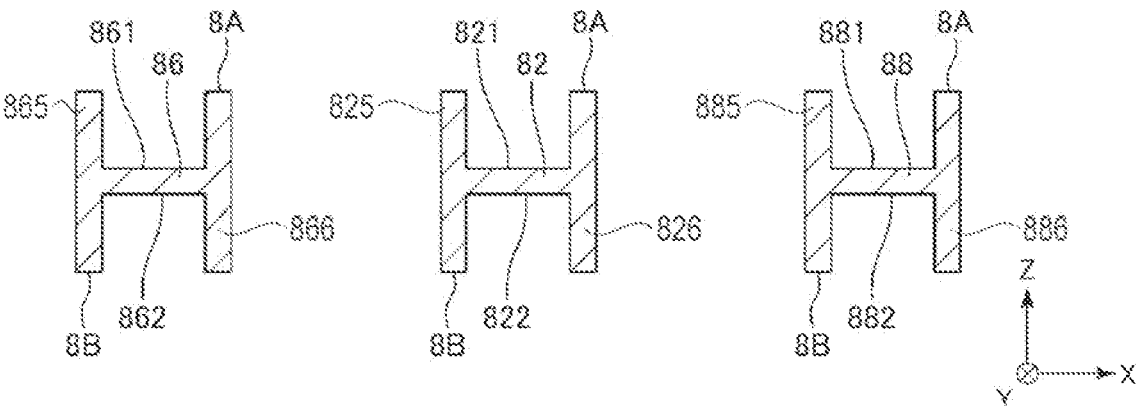
FIG. 36 is a cross sectional view taken along a line A4-A4 in FIG. 35.
Figure 37:
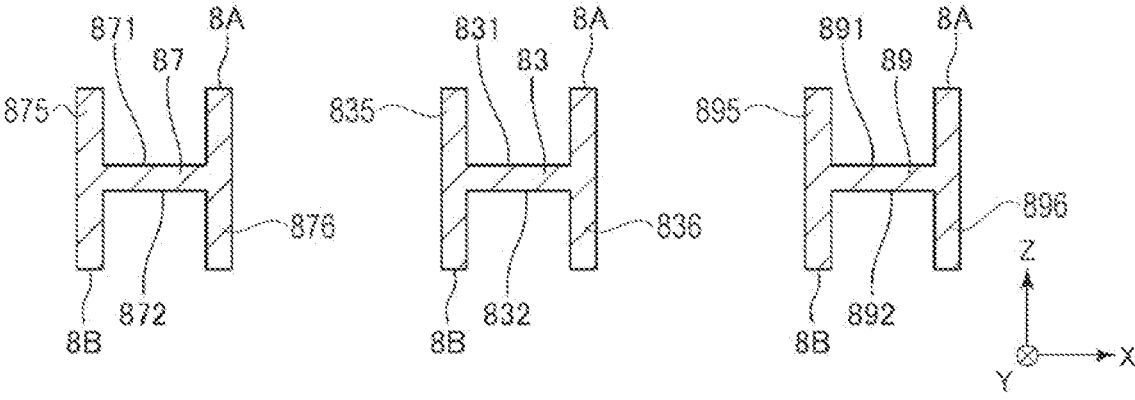
FIG. 37 is a cross sectional view taken along a line A5-A5 in FIG. 35.

The vibrator element may be a gyro vibrator element 8 as shown in FIGS. 35, 36, and 37. In FIGS. 35, 36, and 37, electrodes are not shown. The gyro vibrator element 8 includes a base portion 81, a pair of detection vibration arms 82 and 83 extending from the base portion 81 to both sides of the Y direction, a pair of coupling arms 84 and 85 extending from the base portion 81 to both sides of the X direction, drive vibration arms 86 and 87 extending from a tip end portion of the coupling arm 84 to both sides of the Y direction, and drive vibration arms 88 and 89 extending from a tip end portion of the coupling arm 85 to both sides of the Y direction. In the gyro vibrator element 8, when an angular velocity ωz around the Z axis is applied in a state in which the drive vibration arms 86, 87, 88, 89 perform a flexural vibration in a direction indicated by arrows SD in FIG. 35, a flexural vibration in a direction indicated by arrows SS is newly excited in the detection vibration arms 82 and 83 by a Coriolis force, and the angular velocity ωz is detected based on electric charges output from the detection vibration arms 82 and 83 due to the flexural vibration.

The detection vibration arms 82 and 83 respectively include bottomed first grooves 821 and 831 that open to a first surface 8A, bottomed second grooves 822 and 832 that open to a second surface 8B, first bank portions 825 and 835 that respectively define the first grooves 821 and 831, and second bank portions 826 and 836 that respectively define the second grooves 822 and 832. The drive vibration arms 86, 87, 88, and 89 respectively include bottomed first grooves 861, 871, 881, and 891 that open to the first surface 8A, bottomed second grooves 862, 872, 882, and 892 that open to the second surface 8B, first bank portions 865, 875, 885, and 895 that respectively define the first grooves 861, 871, 881, and 891, and second bank portions 866, 876, 886, and 896 that respectively define the second grooves 862, 872, 882, and 892. In the gyro vibrator element 8, for example, the drive vibration arms 86 and 88 or the drive vibration arms 87 and 89 respectively serve as the first vibration arms and the second vibration arms.

Figure 38:
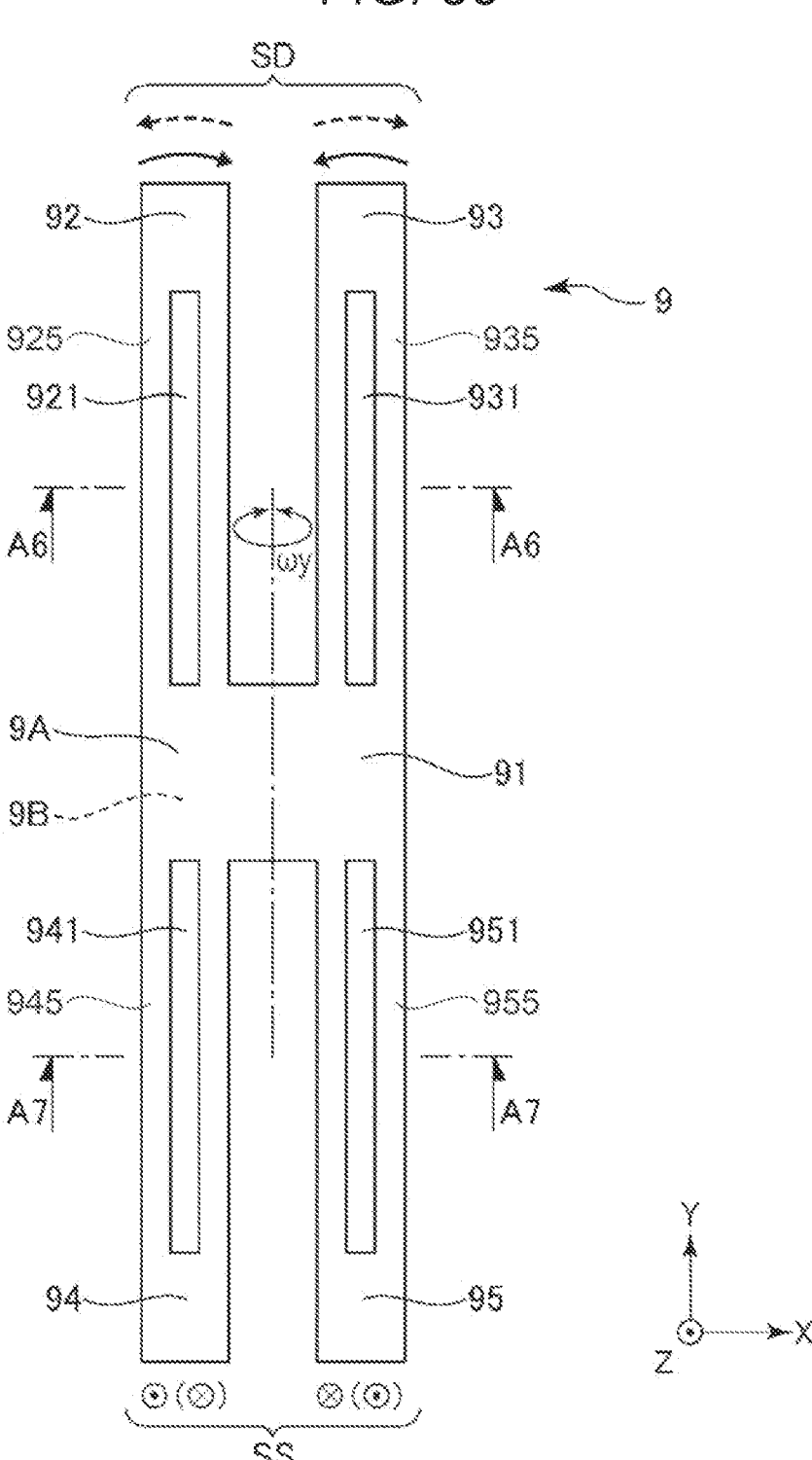
FIG. 38 is a plan view showing a vibrator element according to a modification.
Figure 39:
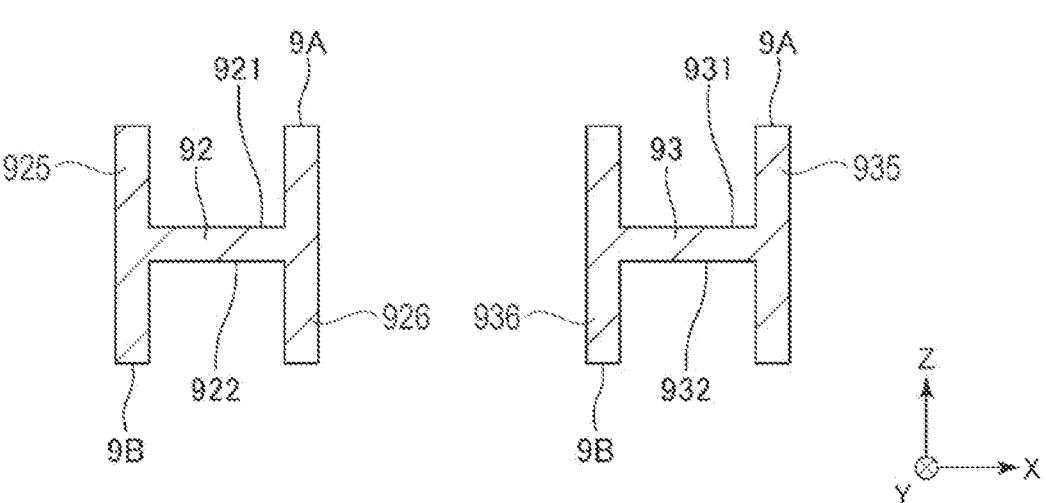
FIG. 39 is a cross sectional view taken along a line A6-A6 in FIG. 38.
Figure 40:
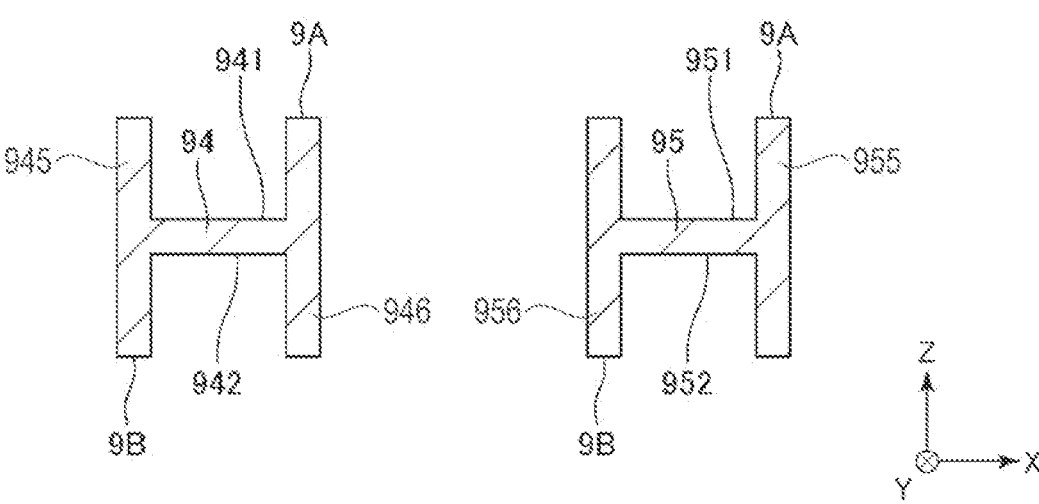
FIG. 40 is a cross sectional view taken along a line A7-A7 in FIG. 38.

The vibrator element may be a gyro vibrator element 9 as shown in FIGS. 38, 39, and 40. In FIGS. 38, 39, and 40, electrodes are not shown. The gyro vibrator element 9 includes a base portion 91, a pair of drive vibration arms 92 and 93 that extend from the base portion 91 to the positive side of the Y direction and are arranged in the X direction, and a pair of detection vibration arms 94 and 95 that extend from the base portion 91 to the negative side of the Y direction and are arranged in the X direction. In the gyro vibrator element 9, when an angular velocity coy around the Y axis is applied in a state in which the drive vibration arms 92 and 93 perform a flexural vibration in a direction indicated by arrows SD in FIG. 38, a flexural vibration in a direction indicated by arrows SS is newly excited in the detection vibration arms 94 and 95 by a Coriolis force, and the angular velocity coy is detected based on electric charges output from the detection vibration arms 94 and 95 due to the flexural vibration.

The drive vibration arms 92 and 93 respectively include bottomed first grooves 921 and 931 that open to a first surface 9A, bottomed second grooves 922 and 932 that open to a second surface 9B, first bank portions 925 and 935 that respectively define the first grooves 921 and 931, and second bank portions 926 and 936 that respectively define the second grooves 922 and 932. The detection vibration arms 94 and 95 respectively include bottomed first grooves 941 and 951 that open to the first surface 9A, bottomed second grooves 942 and 952 that open to the second surface 9B, first bank portions 945 and 955 that respectively define the first grooves 941 and 951, and second bank portions 946 and 956 that respectively define the second grooves 942 and 952. In the gyro vibrator element 9, the drive vibration arms 92 and 93 or the detection vibration arms 94 and 95 respectively serve as the first vibration arms and the second vibration arms.

What is claimed is:

1. A method for manufacturing a vibrator element, which includes a first vibration arm and a second vibration arm that extend along a first direction and that are arranged side by side along a second direction intersecting the first direction, and in which the first vibration arm and the second vibration arm each have a first surface and a second surface that are arranged side by side in a third direction intersecting the first direction and the second direction and that are in a front and back relationship, a bottomed first groove that opens to the first surface, and a bottomed second groove that opens to the second surface, and outer surfaces that extend between and connect the first surface and the second surface in the third direction, the method comprising:

providing a quartz crystal substrate having a first substrate surface and a second substrate surface that are in a front and back relationship;

forming a first protective film on the first substrate surface;

conducting a first dry etching of the first substrate surface of the quartz crystal substrate by way of the first protective film to form the first surface, the first bottomed groove, and the outer surfaces of the first vibration arm and the second vibration arm;

forming a second protective film on the second substrate surface; and conducting a second dry etching of the second substrate surface of the quartz crystal substrate by way of the second protective film to form the second surface and the second bottomed groove, wherein the outer surfaces of the first vibration arm and the second vibration arm are entirely formed from the first surface to the second surface in the first dry etching step such that the outer surfaces of the first vibration arm and the second vibration arm are not formed in the second dry etching step; and wherein the forming the second protective film on the second substrate surface occurs after the first dry etching.

2. The method for manufacturing a vibrator element according to claim 1, wherein the first protective film satisfies a relationship $T1<T2<T3$, wherein $T1$ is a thickness of the first protective film along the third direction in an inter-arm region located between a first vibration arm forming region in which the first vibration arm is formed and a second vibration arm forming region in which the second vibration arm is formed, $T2$ is a thickness of the first protective film along the third direction in a first groove forming region in which the first groove is formed, and $T3$ is a thickness of the first protective film along the third direction in regions of the first vibration arm forming region and the second vibration arm forming region excluding the first groove forming region.

3. The method for manufacturing a vibrator element according to claim 2, wherein in the first protective film, $T1=0$.

4. The method for manufacturing a vibrator element according to claim 1, wherein the first protective film includes an underlayer film and a third protective film, and the formation of the first protective film includes forming the underlayer film on the first substrate surface in a first vibration arm forming region in which the first vibration arm is formed and a second vibration arm forming region in which the second vibration arm is formed, and forming the third protective film on the underlayer film in a region excluding a first groove forming region in which the first groove is formed.

5. The method for manufacturing a vibrator element according to claim 4, wherein the underlayer film is not formed in an inter-arm region located between the first vibration arm forming region and the second vibration arm forming region of the first substrate surface.

6. The method for manufacturing a vibrator element according to claim 1, further comprising:

removing, after the first dry etching is ended in a state in which the first protective film remains on the first substrate surface, the remained first protective film.

7. The method for manufacturing a vibrator element according to claim 6, further comprising:

removing, after the second dry etching is ended in a state in which the second protective film remains on the second substrate surface, the remained second protective film.

* * * * *